United States Patent
Hartman et al.

(10) Patent No.: US 10,492,330 B2
(45) Date of Patent: Nov. 26, 2019

(54) MULTI-FORM FACTOR POWER SUPPLY BAY SYSTEM

(71) Applicant: Dell Products L.P., Round Rock, TX (US)

(72) Inventors: Corey Dean Hartman, Hutto, TX (US); Mark A. Muccini, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/363,409

(22) Filed: Mar. 25, 2019

(65) Prior Publication Data

US 2019/0223315 A1 Jul. 18, 2019

Related U.S. Application Data

(63) Continuation of application No. 15/605,678, filed on May 25, 2017, now Pat. No. 10,244,651.

(51) Int. Cl.
*H05K 7/14* (2006.01)

(52) U.S. Cl.
CPC ......... *H05K 7/1492* (2013.01); *H05K 7/1489* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,515,239 A | * | 5/1996 | Kamerman | H05K 7/1441 206/509 |
| 5,602,721 A | * | 2/1997 | Slade | G06F 1/18 206/504 |
| 5,768,099 A | * | 6/1998 | Radloff | G06F 1/184 360/137 |
| 5,790,372 A | * | 8/1998 | Dewey | G06F 1/189 312/223.2 |
| 5,913,926 A | * | 6/1999 | Anderson | G06F 1/184 360/98.01 |
| 5,949,644 A | * | 9/1999 | Park | G06F 3/033 361/679.32 |
| 6,141,221 A | * | 10/2000 | Tong | H05K 5/0021 312/223.1 |
| 6,205,020 B1 | * | 3/2001 | Felcman | G06F 1/18 312/223.2 |

(Continued)

*Primary Examiner* — Lisa Lea-Edmonds
(74) *Attorney, Agent, or Firm* — Haynes and Boone, LLP

(57) ABSTRACT

A power supply system includes a chassis defining a bay. Power supply form factor element(s) are located on the chassis adjacent the bay. The power supply form factor element(s) may be used to guide a first form factor power supply through the bay and into engagement with a connector when the first form factor power supply is moved through a bay entrance, or guide a second form factor power supply through the bay and into engagement with a portion of the connector when the second form factor power supply is moved through a first section of the bay entrance. Furthermore, the power supply form factor element(s) prevent movement of the second form factor power supply through the bay and into engagement with the connector when the second form factor power supply attempts to move through a second section of the bay entrance that is different than the first section.

20 Claims, 26 Drawing Sheets

(56) References Cited

U.S. PATENT DOCUMENTS

| | | | |
|---|---|---|---|
| 6,215,664 B1 * | 4/2001 | Hernandez | G06F 1/181 |
| | | | 361/725 |
| 7,372,703 B2 | 5/2008 | Cheng et al. | |
| 9,213,385 B2 | 12/2015 | Berke et al. | |
| 9,582,450 B2 * | 2/2017 | Luck | G06F 1/181 |
| 9,811,128 B2 * | 11/2017 | Marcade | H05K 5/023 |
| 10,244,651 B2 * | 3/2019 | Hartman | H05K 7/1489 |
| 2006/0285289 A1 * | 12/2006 | Jones | G06F 1/181 |
| | | | 361/679.31 |
| 2012/0275104 A1 * | 11/2012 | Hamand | H05K 5/023 |
| | | | 361/679.31 |
| 2014/0040524 A1 * | 2/2014 | Luck | G06F 1/181 |
| | | | 710/306 |
| 2018/0343766 A1 * | 11/2018 | Hartman | H05K 7/1489 |

\* cited by examiner

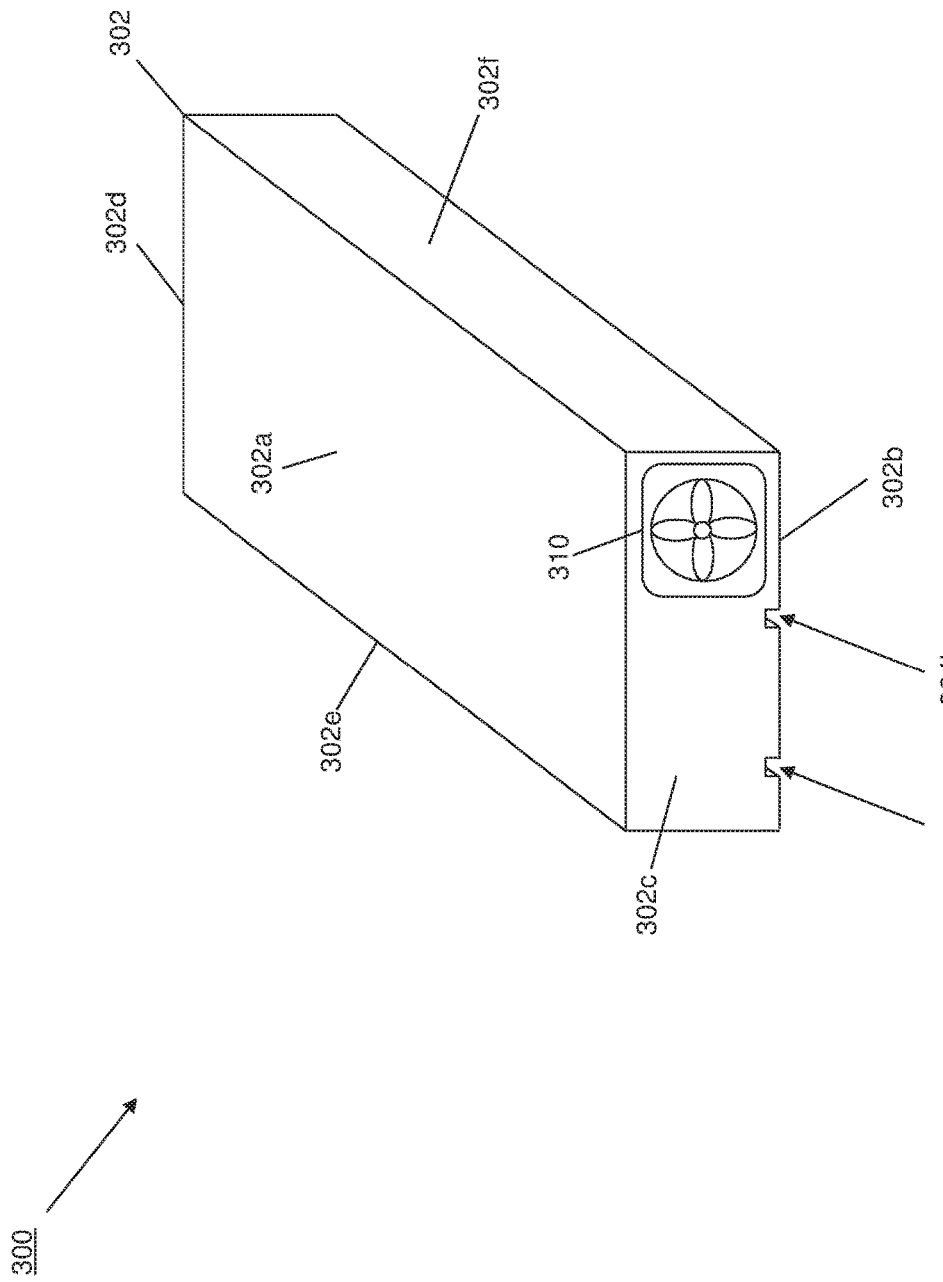

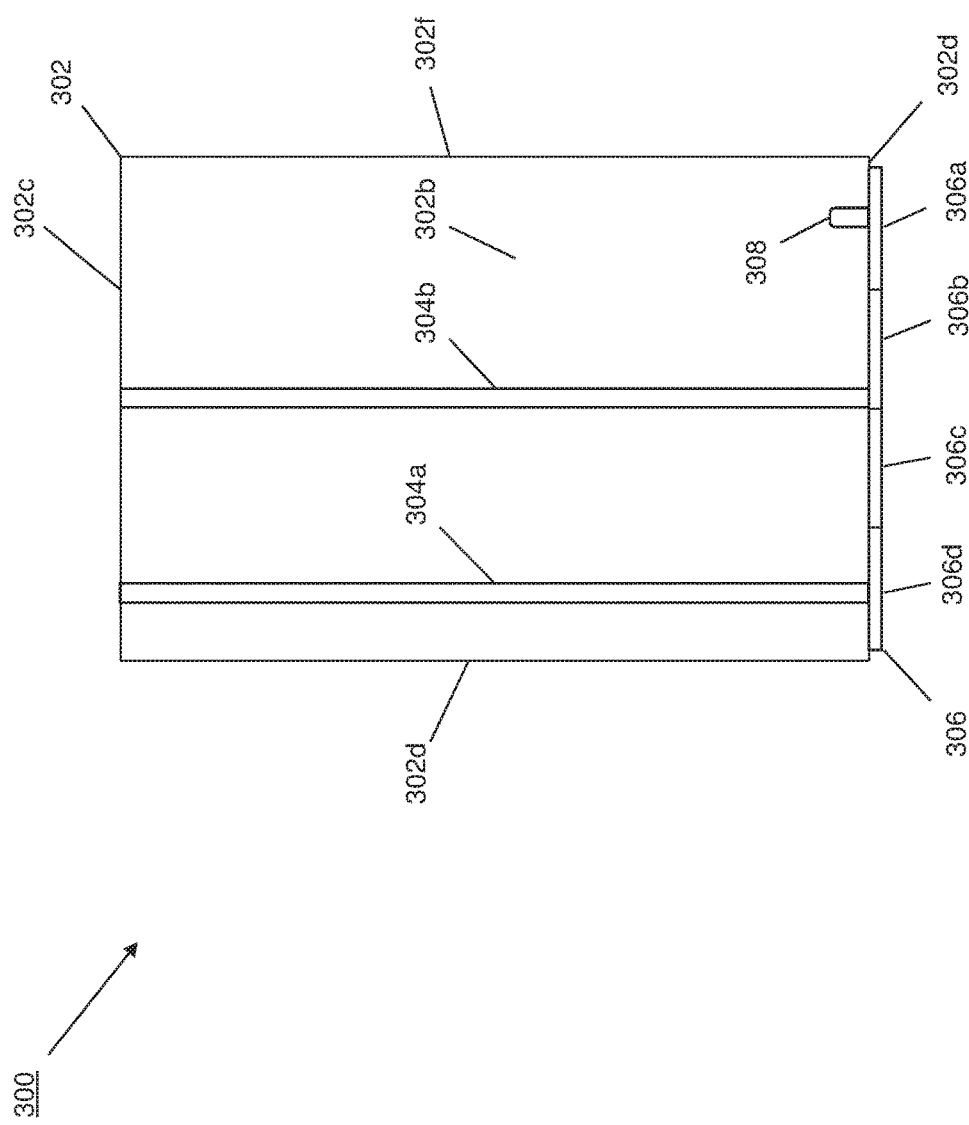

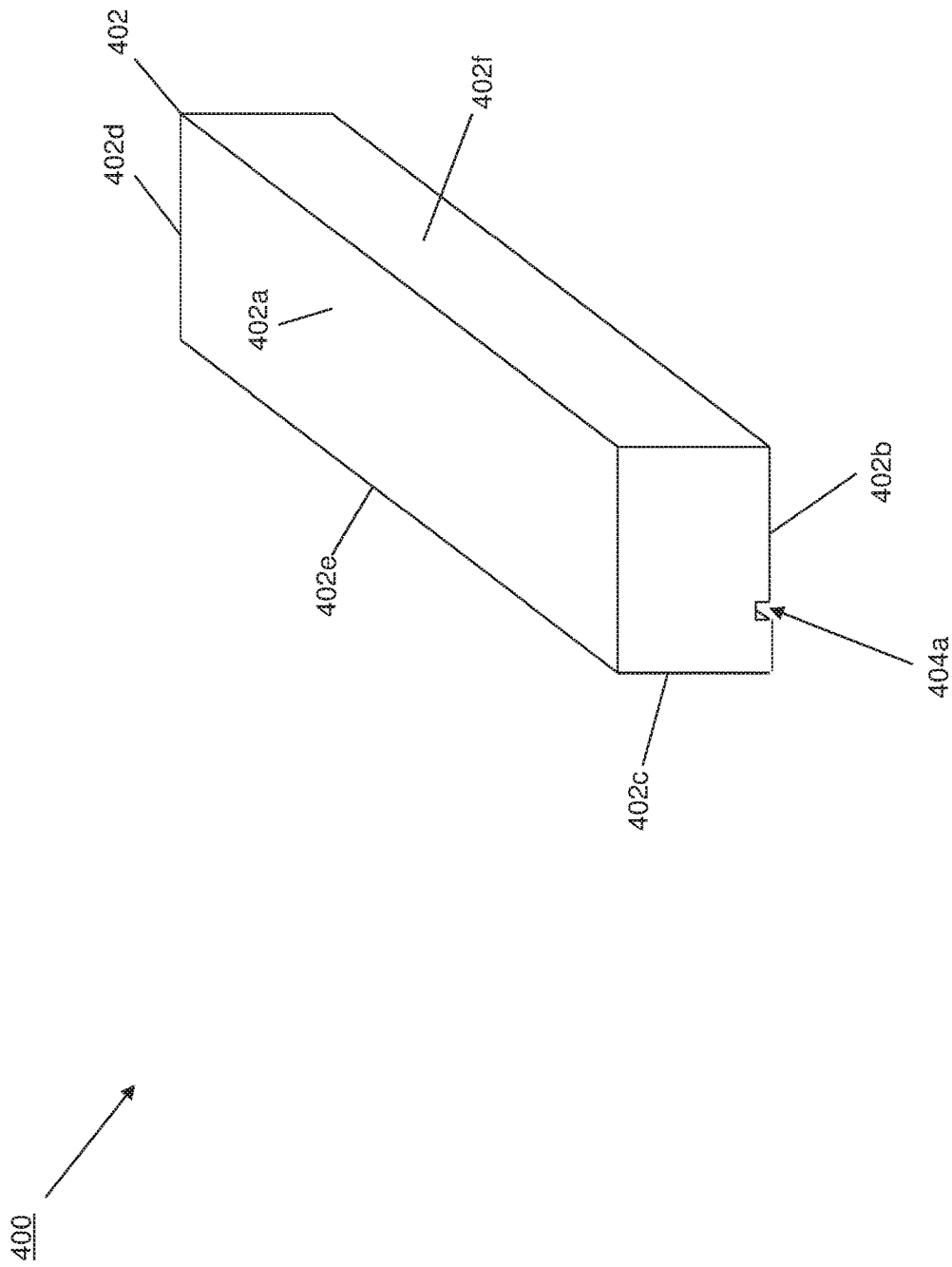

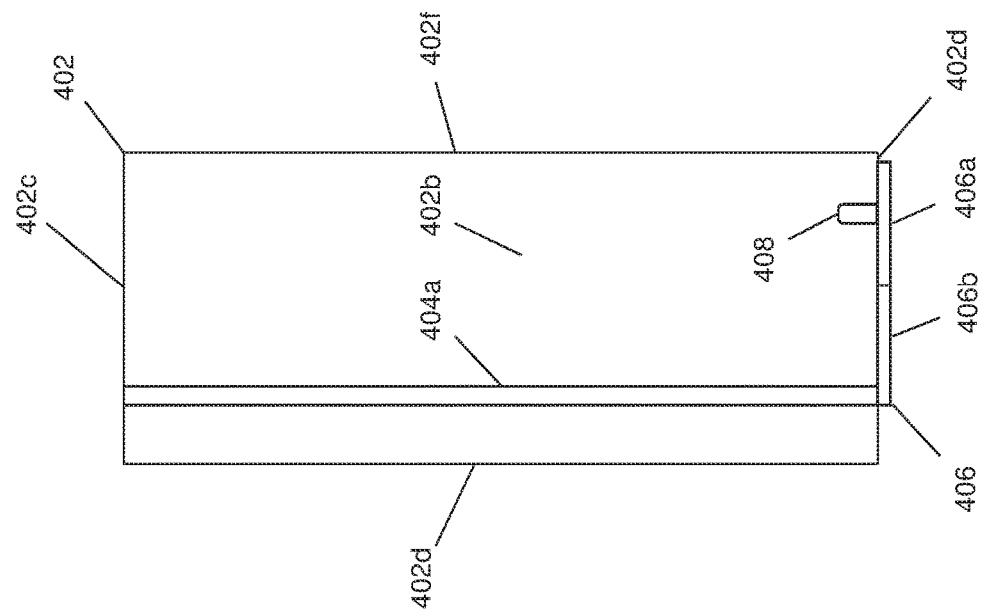
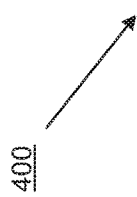
FIG. 4B

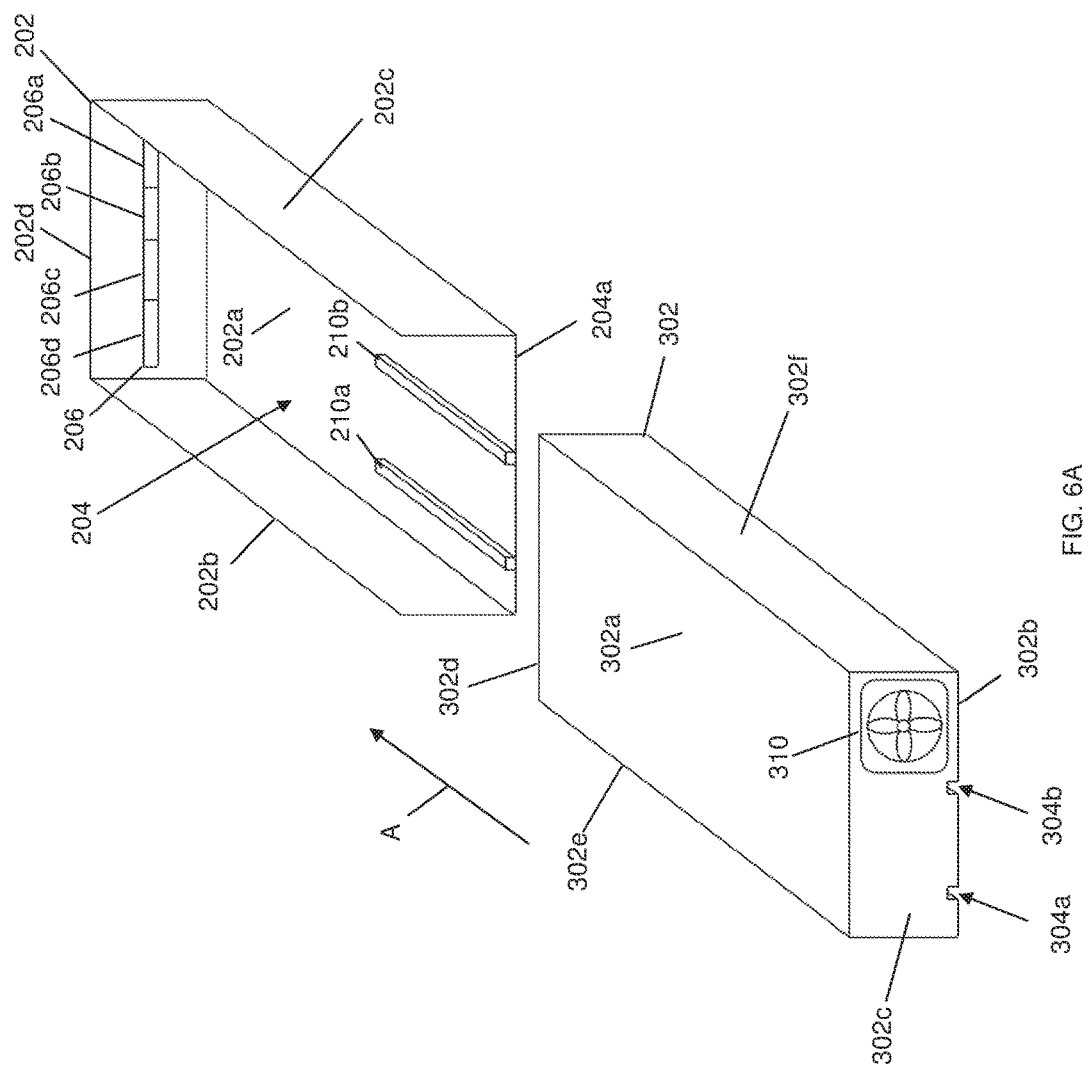

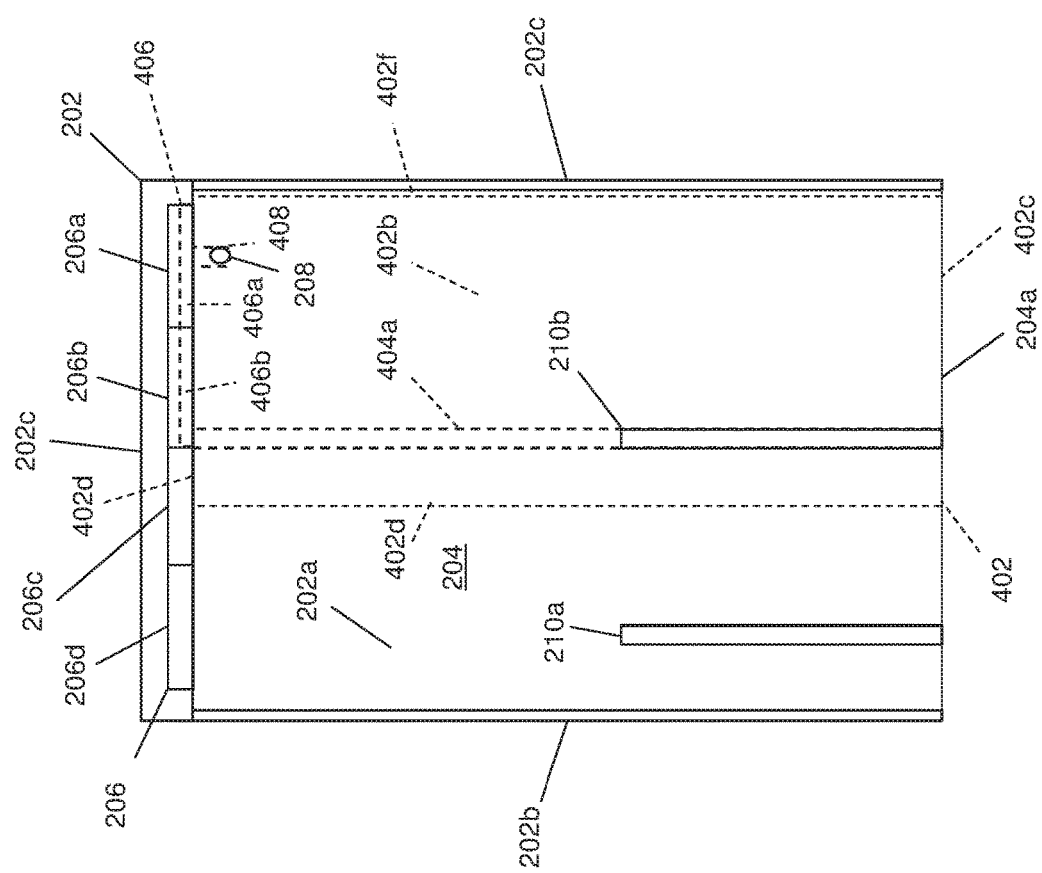

MULTI-FORM FACTOR POWER SUPPLY BAY SYSTEM

CROSS-REFERENCE TO RELATED APPLICATIONS

This is a Continuation application to U.S. Utility application Ser. No. 15/605,678 filed May 25, 2017, entitled "MULTI-FORM FACTOR POWER SUPPLY BAY SYSTEM," the disclosure of which is incorporated herein by reference in its entirety.

BACKGROUND

The present disclosure relates generally to information handling systems, and more particularly to a system enabling different form factor power supplies to be coupled to an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems such as, for example, server devices, switch devices, storage devices, and/or other computing devices known in the art, are designed to provide a variety of different performance levels that may require a variety of different amounts of power. For example a computing device "family" may utilize a common chassis that can be provided with a variety of different components that require various amounts of power in order to provide various associated performance levels. As such, computing devices that are part of the same computing device family may be configured with components that provide the computing device as a "high end" computing device in the computing device family with relatively high power requirements, or with components that provide the computing device as a "low end" computing device in the computing device family with relatively low power requirements.

In general, it is desirable to provide power supply systems in computing devices that have an output capacity that is close to the highest expected load from the computing device, as doing so is cost effective and efficient. However, given the variety of performance levels that computing devices are capable of, and the power requirements associated with those performance levels, this may require the manufacture of a variety of different power supply systems that provide sufficient output capacity for each of the computing devices in the computing device family. As such, computing device manufacturers typically provide the common chassis for a computing device family with a power supply system bay that is dimensioned the same for each computing device configuration available in the common chassis, and the computing device manufacturer or power supply system manufacturers then manufacture a power supply portfolio of power supply systems with a common form factor and different output capacities that are sufficient for the different configurations/performance levels available for computing devices in the computing device family. However, as the disparity between high and low end computing devices in computing device families grows, the output capacity required by power supply systems across the computing device family can exceed several kilowatts. Furthermore, power supply system density is nearing a level where existing power supply system form factors cannot support the higher output capacity needs of high end computing devices, requiring power supply systems to be made larger, or additional power supply systems to be added to those computing devices.

In conventional computing device families, the computing device configuration needing the highest power supply system output capacity is used to set the size of the power supply system bay and associated power supply system form factor, which is necessary to address the higher heat loss, larger magnetics, additional switching devices, and other power supply system components utilized in those high output capacity power supply systems. As a result, computing devices in the computing device family with lower power supply system output capacity requirements are not power density optimized. Furthermore, many computing devices in the computing device family may not require the output capacity required by the higher end computing devices, but may be forced to utilize those higher output capacity power supply systems, as if a smaller form factor is used for the power supply system bay the performance level of computing devices at the higher end of the computing device family will be limited. Thus, the provisioning of scalable power supply system solutions that enable both high performance at competitive cost points is difficult, because as the range of power requirements supported becomes broader, the trade-offs required at the end product lines become more significant. As such, conventional power supply system portfolios are provided to support a single computing device family.

Accordingly, it would be desirable to provide an improved power supply system.

SUMMARY

According to one embodiment, an information handling system (IHS) includes a chassis; a processing system that is located in the chassis; a memory system that is located in the chassis and that is coupled to the processing system; a device housing that is defined by the chassis and that includes a device entrance; a device connector that is coupled to the processing system and that is located on the chassis adjacent the device housing and opposite the device housing from the device entrance; and at least one device form factor element that is located on the chassis adjacent the device housing, wherein the at least one device form factor element is configured to: guide a first form factor device through the device housing and into engagement with the device connector when the first form factor device is moved through the device entrance; guide a second form factor device through the device housing and into engagement with a portion of the device connector when the second form factor device is moved through a first section of the device entrance, wherein the second form factor device has a different form factor than the first form factor device; and prevent movement of the second form factor device through the device housing and into engagement with the device connector when the second form factor device attempts to move through a second section of the device entrance that is different than the first section.

BRIEF DESCRIPTION OF THE DRAWINGS

FIG. 3A is a perspective view illustrating an embodiment of a first form factor power supply system used with the power supply system bay of FIGS. 2A and 2B.

FIG. 3B is a bottom view illustrating an embodiment of the first form factor power supply system of FIG. 3A.

FIG. 4A is a perspective view illustrating an embodiment of a second form factor power supply system used with the power supply system bay of FIGS. 2A and 2B.

FIG. 4B is a bottom view illustrating an embodiment of the second form factor power supply system of FIG. 4A.

FIG. 6A is a perspective view illustrating the first form factor power supply system of FIGS. 3A and 3B being coupled to the power supply system bay of FIGS. 2A and 2B.

FIG. 8C is a top view illustrating the second form factor power supply system of FIGS. 4A and 4B coupled to the power supply system bay of FIGS. 2A and 2B.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
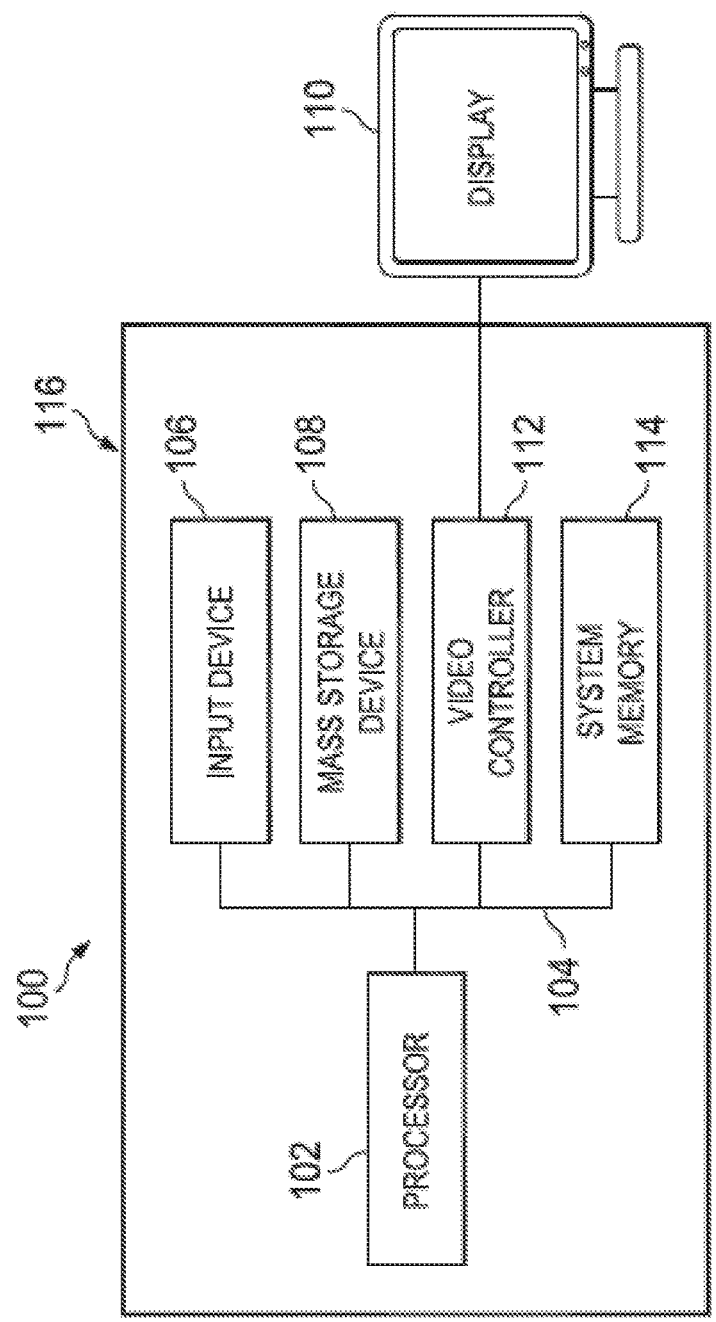
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
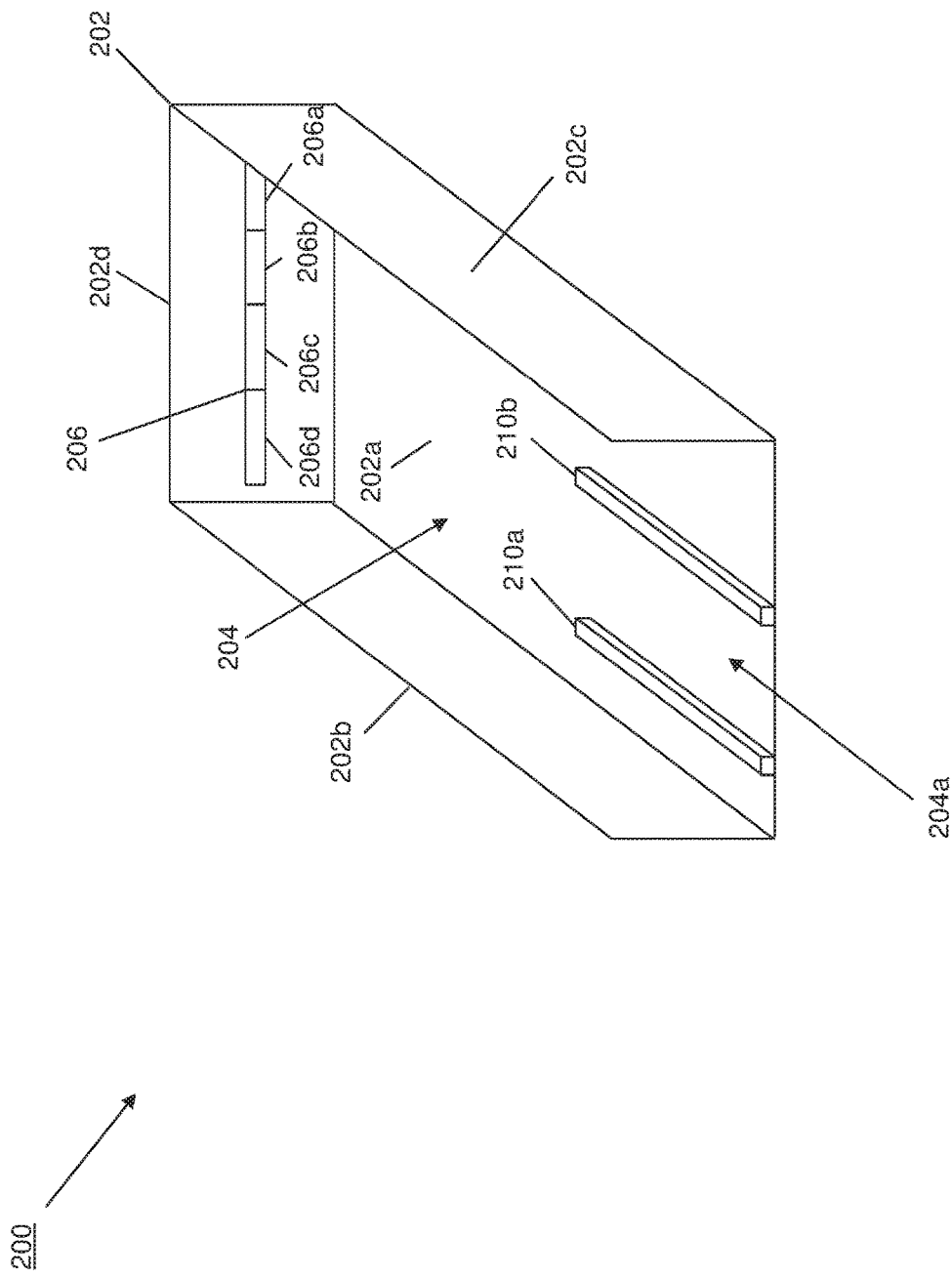
FIG. 2A is a perspective view illustrating an embodiment of a power supply system bay.
Figure 2B:
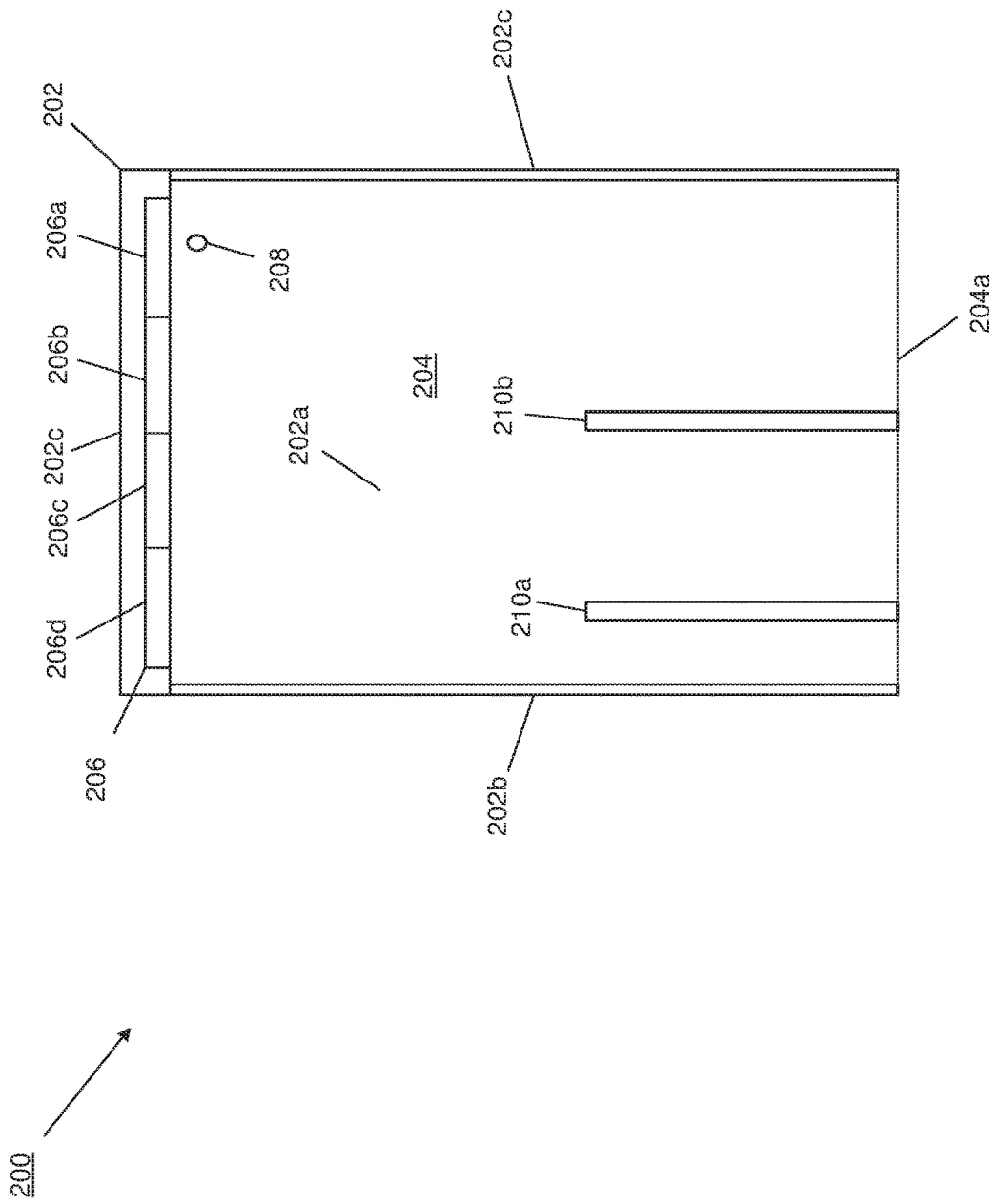
FIG. 2B is a top view illustrating an embodiment of the power supply system bay of FIG. 2A.

Referring now to FIGS. 2A and 2B, an embodiment of a chassis 200 is illustrated. In an embodiment, the chassis 200 may be provided as part of the chassis 116 discussed above with reference to FIG. 1, and thus may be provided with an IHS 100 or provided to house one or more components of the IHS 100. In specific examples, the portion of the chassis 200 may be included in a server device, although switch devices, storage devices, desktop computing devices, laptop/notebook computing devices, and/or other computing devices will benefit from the teachings of the present disclosure and thus fall within its scope. The chassis 200 illustrated in FIGS. 2A and 2B includes a base 202 that, in the illustrated embodiment, includes a bottom wall 202a, a pair of side walls 202b and 202c that extend substantially perpendicularly from opposite edges of the bottom wall 202a, and a end wall 202d that extends from an edge of the bottom wall 202a and between the bottom wall 202a and the side walls 202b and 202c. However, one of skill in the art in possession of the present disclosure will recognize that the chassis 200 may include a top wall (which has been omitted for clarity of illustration and discussion, and allow viewing of components in the portion of the chassis 200), and the chassis 200 may include a variety of features and house a variety of components (i.e., the IHS components discussed above with reference to FIG. 1) while remaining within the scope of the present disclosure.

In the embodiments discussed below, the base 202 of the chassis 200 defines a power supply system bay 204 between the bottom wall 202a, the side walls 202b and 202c, and the end wall 202d, as well as a power supply system bay entrance 204a between the edges of the bottom wall 202a and side walls 202b and 202c that are opposite the base 202 from the end wall 202d. However, the teachings of the present disclosure may be utilized in providing a variety of device housings other than power supply system bays, and thus the applications of those teachings to such devices and device housings is envisioned as falling within the scope of the present disclosure as well. While not illustrated, the chassis 200 may include a variety of power supply system latching features for securing a power supply system (or other devices) in the power supply system bay 204, discussed in further detail below. Furthermore, while the power supply system bay 204 is illustrated and described as being provided in a generally horizontal orientation (i.e., relative to a server chassis in which it is located) that provides for movement of power supply systems in a generally horizontal direction in and out of the power supply system bay 204, one of skill in the art in possession of the present disclosure will recognize that the power supply system bay 204 may be oriented vertically (i.e., relative to a server chassis in which it is located) to provide for movement of power supply systems in a generally vertical direction in and out of the power supply system bay 204 while remaining within the scope of the present disclosure as well.

In the illustrated embodiment, a power supply system bay connector 206 is located on or adjacent the end wall 202d, and includes a signal connector portion 206a, and a plurality of power connector portions 206b, 206c, and 206d. However, the number and orientations of the signal connector portion 206a and the power connector portions 206b-d may change depending the application of the teachings of the present disclosure. For example, additional signal connector portions (other than the illustrated signal connector portion 206a) may be provided to connect additional devices, as discussed in further detail below. Furthermore, device connectors for devices other than power supply systems may be provided in place of the power supply system bay connector 206, and may include other types of connector portions while remaining within the scope of the present disclosure as well.

In the illustrated embodiment, a connector alignment member 208 is located on the bottom wall 202a and located adjacent the power supply system bay connector 206. While the connector alignment member 208 is illustrated and described below as a peg or other element extending from the bottom wall 202a and into the power supply system bay 204, in other embodiments the connector alignment member 208 may be provided by a channel (e.g., defined by the bottom wall 202a) and/or other chassis features that one of skill in the art in possession of the present disclosure would recognize will provided for the alignment functionality discussed below while remaining within the scope of the present disclosure. Furthermore, in some embodiments the connector alignment member 208 may be omitted, or other locations for the connector alignment member 208 may be utilized (e.g., the side wall 202b or 202c) while remaining within the scope of the present disclosure as well.

As discussed below, the chassis 200 also includes at least one power supply system form factor element that is configured to allow for the movement of different form factor power supplies through the power supply system bay 204 and into engagement with at least a portion of the power supply system bay connector 206. In the illustrated embodiment, a first power supply system form factor element 210a and a second power supply system form factor element 210b extend from the bottom wall 202a in a spaced apart orientation from each other and the side walls 202b and 202c. While the first power supply system form factor element 210a and the second power supply system form factor element 210b are illustrated as rails that extend from the bottom wall 202a, one of skill in the art in possession of the present disclosure will recognize that power supply form factor element(s) may be provided as channels, slots, tabs, keying elements, and/or a variety of other features that may be located in a variety of locations other than those illustrated while still performing the functionality of the power supply form factor element(s) discussed below and remaining within the scope of the present disclosure. For example, the power supply system form factor elements may be provided by posts, studs, or other members that extend from the base 202 anywhere between the power supply system bay entrance 204a and the power supply system bay connector 206 (e.g., from the bottom wall 202a similarly to the first power supply system form factor element 210a and the second power supply system form factor element 210b), and that are configured to operate with the power supply system guides as described below.

In the embodiments discussed below, the second power supply system form factor element 210b allows a plurality of different form factor power supply systems to be positioned in a "primary section" of the power supply system bay 204 that is configured to always house the power supply system for the computing device, while the first power supply system form factor element 210a restricts a "secondary section" of the power supply system bay 204 to housing (along with the "primary section" of the power supply system bay 204) particular, larger form factor power supply systems for the computing device (or smaller form factor power supply systems along with secondary devices such as the air plugs, batteries, and/or storage devices discussed below.) However, the number, spacing, and dimensions of the at least one power supply system form factor element may be selected to provide the benefits described below, and may differ depending on the dimensions of the power supply systems, the number of different form factors power supply systems that are to-be provided in the power supply system bay, and/or other factors that would be apparent to one of skill in the art in possession of the present disclosure. Further still, the power supply system form factor element(s) may be replaced by device form factor element(s) that perform the functionality below for a variety of devices other than power supply systems while remaining within the scope of the present disclosure.

Referring now to FIGS. 3A and 3B, an embodiment of a first form factor power supply system 300 is illustrated. In an embodiment, the first form factor power supply system 300 may be provided in the chassis 116 discussed above with reference to FIG. 1 in order to provide power to the IHS components in the IHS 100. In specific examples, the first form factor power supply system 300 may include a variety of power supply systems and/or components known in the art, although other devices that couple to computing systems via device housings will benefit from the teachings of the present disclosure as well and thus will fall within its scope. In the embodiments discussed below, the first form factor power supply system 300 includes a maximum form factor power supply system that may be used with the power supply system bay 204 discussed above with reference to FIG. 2. However, first form factor power supply system may be provided with dimensions that do not use up all the volume available in the power supply system bay 204 while remaining within the scope of the present disclosure. The first form factor power supply system 300 illustrated in FIGS. 3A and 3B includes a base 302 that, in the illustrated embodiment, includes a top surface 302a, a bottom surface 302b that is located opposite the base 302 from the top surface 302a, a front surface 302c that extends between the top surface 302a and the bottom surface 302b, a rear surface 302d that is located opposite the base 302 from the front surface 302c, and a pair of side surfaces 302e and 302f that are located opposite the base 302 from each other and that extend between the top surface 302a, the bottom surface 302b, the front surface 302c, and the rear surface 302c. Furthermore, one of skill in the art in possession of the present disclosure will recognize that the first form factor power supply system 300 may include a variety of elements and components (i.e., coupling elements, securing elements, management elements, etc.) while remaining within the scope of the present disclosure.

In the embodiments discussed below, the base 302 of the first form factor power supply system 300 includes at least one power supply system guide that is configured to engage the at least one power supply system form factor element on the chassis 200, discussed above, to guide the first form factor power supply system 300 through the power supply system bay 204. In the illustrated embodiment, a first power supply system guide 304a and a second power supply system guide 304b are defined by the base 302 and extend into the bottom surface 302b in a spaced apart orientation from each other and the side surfaces 302e and 302e, while extending in a substantially parallel orientation to each other between the front surface 302c and the rear surface 302d. While the first power supply system guide 304a and the second power supply system guide 304b are illustrated as channels that are defined by the base 302 and extend into the bottom wall 302b, one of skill in the art in possession of the present disclosure will recognize that power supply system guide(s) may be provided as rails, keying elements, and/or a variety of other features that will perform the functionality of the power supply system guide(s) discussed below while remaining within the scope of the present disclosure. Furthermore, the number, spacing, and dimensions of the at least one power supply system guide may be selected to provide the benefits described below, and may differ depending on the dimensions of the power supply systems, the number of different form factors power supply systems that are to-be provided in the power supply system bay 204, and/or other factors that would be apparent to one of skill in the art in possession of the present disclosure. Further still, the power supply system guide(s) may be replaced by device guide(s) that perform the functionality below for a variety of devices other than power supply systems while remaining within the scope of the present disclosure.

In the illustrated embodiment, a power supply system connector 306 is located on the rear surface 302d of the base 302, and includes a signal connector portion 306a, and a plurality of power connector portions 306b, 306c, and 306d. However, the number and orientation of the signal connector portion 306a and the power connector portions 306b-d may change depending the application of the teachings of the present disclosure. Furthermore, device connectors for devices other than power supply systems may be provided in place of the power supply system connector 306, and may include other types of connector portions while remaining within the scope of the present disclosure as well. In the illustrated embodiment, a connector alignment member 308 is located on the bottom surface 302b of the base 302 and adjacent the power supply system connector 306. While the connector alignment member 308 is illustrated and described below as a channel or other element defined by the base 302 and extending into the bottom surface 302b, in other embodiments the connector alignment member 308 may be provided by a peg or other element (e.g., extending from the bottom surface 302b) and/or other chassis features that one of skill in the art in possession of the present disclosure would recognize will provide for the alignment functionality discussed below while remaining within the scope of the present disclosure. Furthermore, in some embodiments the connector alignment member 308 may be omitted, or other locations for the connector alignment member 308 may be utilized (e.g., the side surfaces 302d and 302f) while remaining within the scope of the present disclosure as well. The first form factor power supply system 300 also includes a fan subsystem 310 that is located on the base 302 adjacent the front surface 302c, and that is configured to move air through a housing defined by the base 302 in order to, for example, cool power supply system components located in that housing.

Referring now to FIGS. 4A and 4B, an embodiment of a second form factor power supply system 400 is illustrated. In an embodiment, the second form factor power supply system 400 may be provided in the chassis 116 discussed above with reference to FIG. 1 in order to provide power to the IHS components in the IHS 100. In specific examples, the second form factor power supply system 400 may include a variety of power supply systems and/or components known in the art, although other devices that couple to computing systems via device housings will benefit from the teachings of the present disclosure as well and thus will fall within its scope. In the embodiments discussed below, the second form factor power supply system 400 includes a relatively smaller form factor power supply system that may be used with the power supply system bay 204 discussed above with reference to FIG. 2 without using up all the volume available in the power supply system bay 204. However, second form factor power supply system may be provided with dimensions that use up more or less of the volume available in the power supply system bay 204 while remaining within the scope of the present disclosure. The second form factor power supply system 400 illustrated in FIGS. 4A and 4B includes a base 402 that, in the illustrated embodiment, includes a top surface 402a, a bottom surface 402b that is located opposite the base 402 from the top surface 402a, a front surface 402c that extends between the top surface 402a and the bottom surface 402b, a rear surface 402d that is located opposite the base 402 from the front surface 402c, and a pair of side surfaces 402e and 402f that are located opposite the base 402 from each other and that extend between the top surface 402a, the bottom surface 402b, the front surface 402c, and the rear surface 402c. Furthermore, one of skill in the art in possession of the present disclosure will recognize that the second form factor power supply system 400 may include a variety of elements and components (i.e., coupling elements, securing elements, management elements, etc.) while remaining within the scope of the present disclosure.

In the embodiments discussed below, the base 402 of the second form factor power supply system 400 includes at least one power supply system guide that is configured to engage the at least one power supply system form factor element on the portion of the chassis 200, discussed above, to guide the second form factor power supply system 400 through the power supply system bay 204. In the illustrated embodiment, a power supply system guide 404a is defined by the base 402 and extends into the bottom surface 402b in a spaced apart orientation from the side surfaces 402e and 402f, while extending between the front surface 402c and the rear surface 402d. While the power supply system guide 404a is illustrated as a channel that is defined by the base 402 and extends into the bottom wall 402b, one of skill in the art in possession of the present disclosure will recognize that power supply system guide(s) may be provided as rails, keying elements, and/or a variety of other features that will perform the functionality of the power supply system guide(s) discussed below while remaining within the scope of the present disclosure. Furthermore, the number, spacing, and dimensions of the at least one power supply system guide may be selected to provide the benefits described below, and may differ depending on the dimensions of the power supply systems, the number of different form factors power supply systems that are to-be provided in the power supply system bay, and/or other factors. Further still, the power supply system guide(s) may be replaced by device guide(s) that perform the functionality below for a variety of devices other than power supply systems while remaining within the scope of the present disclosure.

In the illustrated embodiment, a power supply system connector 406 is located on the rear surface 402d of the base 402, and includes a signal connector portion 406a and a power connector portion 406b. However, the number and orientation of the signal connector portion 406a and the power connector portion 406b may change depending the application of the teachings of the present disclosure. Furthermore, device connectors for devices other than power supply systems may be provided in place of the power supply system connector 406, and may include other types of connector portions while remaining within the scope of the present disclosure as well. In the illustrated embodiment, a connector alignment member 408 is located on the bottom surface 402b of the base 402 and adjacent the power supply system connector 406. While the connector alignment member 408 is illustrated and described below as a channel or other element defined by the base 402 and extending into the bottom surface 402b, in other embodiments the connector alignment member 408 may be provided by a peg or other element (e.g., extending from the bottom surface 402b) and/or other chassis features that one of skill in the art in possession of the present disclosure would recognize will provide for the alignment functionality discussed below while remaining within the scope of the present disclosure. Furthermore, in some embodiments the connector alignment member 408 may be omitted, or other locations for the connector alignment member 408 may be utilized (e.g., the side surfaces 402d and 402f) while remaining within the scope of the present disclosure as well.

With reference to the first form factor power supply system 300 of FIGS. 3A and 3B, and the second form factor power supply system 400 of FIGS. 4A and 4B, the different form factor power supply systems illustrated and described herein are provided as an example stemming from experimental embodiments taken from real-world power supply system portfolios provided with different server families. In that experimental embodiment, the first form factor power supply system 300 is dimensioned similarly as an 86 millimeter width form factor power supply portfolio that was provided for a first server family, while the second form factor power supply system 400 is dimensioned similarly as a 51.3 millimeter width form factor power supply portfolio for a second server family. Furthermore, in providing the different power requirements for the first server family, the 86 millimeter width form factor power supply portfolio was configurable with 7 different power configurations: a "platinum-level" efficiency 2.4 kilowatt power configuration, a "platinum-level" efficiency 2.0 kilowatt power configuration, a "platinum-level" efficiency 1.4 kilowatt power configuration, a "platinum-level" efficiency 1.1 kilowatt power configuration, a "platinum-level" efficiency 1.1 kilowatt power configuration with a negative 48-volt input voltage, a "platinum-level" efficiency 750 watt power configuration, and a "platinum-level" efficiency 495 watt power configuration. Similarly, in providing the different power requirements for the first server family, the 51.3 millimeter width form factor power supply portfolio was configurable with 5 different power configurations: a "platinum-level" efficiency 1.4 kilowatt power configuration with a negative 48-volt input voltage, a "platinum-level" efficiency 1.1 kilowatt power configuration with a negative 48-volt input voltage, a "platinum-level" efficiency 750 watt power configuration, a "titanium-level" efficiency 750 watt power configuration, and a "platinum-level" efficiency 495 watt power configuration. However, one of skill in the art in possession of the present disclosure will recognize that a variety of different efficiency/capacity Stock Keeping Units (SKUs) that provide a plurality of total SKUs in a power supply portfolio may be utilized with the teachings of the present disclosure while remaining within its scope.

As such, in the experimental embodiment described above, 12 different power configurations across two different form factors power supply portfolios were required in order to satisfy the power requirements across two different server families. In particular, the 51.3 millimeter width form factor power supply portfolio and associated power configurations were provided for servers with relatively lower power requirements and/or relatively spaced constrained servers, while the 86 millimeter width form factor power supply portfolio and associated power configurations may be provided for servers with relatively higher power requirements and/or relatively less spaced constrained servers. However, one of skill in the art in possession of the present disclosure will recognize that, depending on the server families and their power requirements, a variety of different sized power supply system form factors and/or power configurations may be required. Regardless of the specific details of the server and/or other device families (e.g., switch families, storage system families, desktop computing families, laptop/notebook computing families, etc.), the desire to appropriately size power supply systems for the power requirements of computing devices results in the need for computing device and/or power supply manufacturers to design and manufacture a relatively large number of different form factor power supply systems, and power configurations thereof, when utilizing conventional power supply systems and associated power supply system bays.

Figure 5:
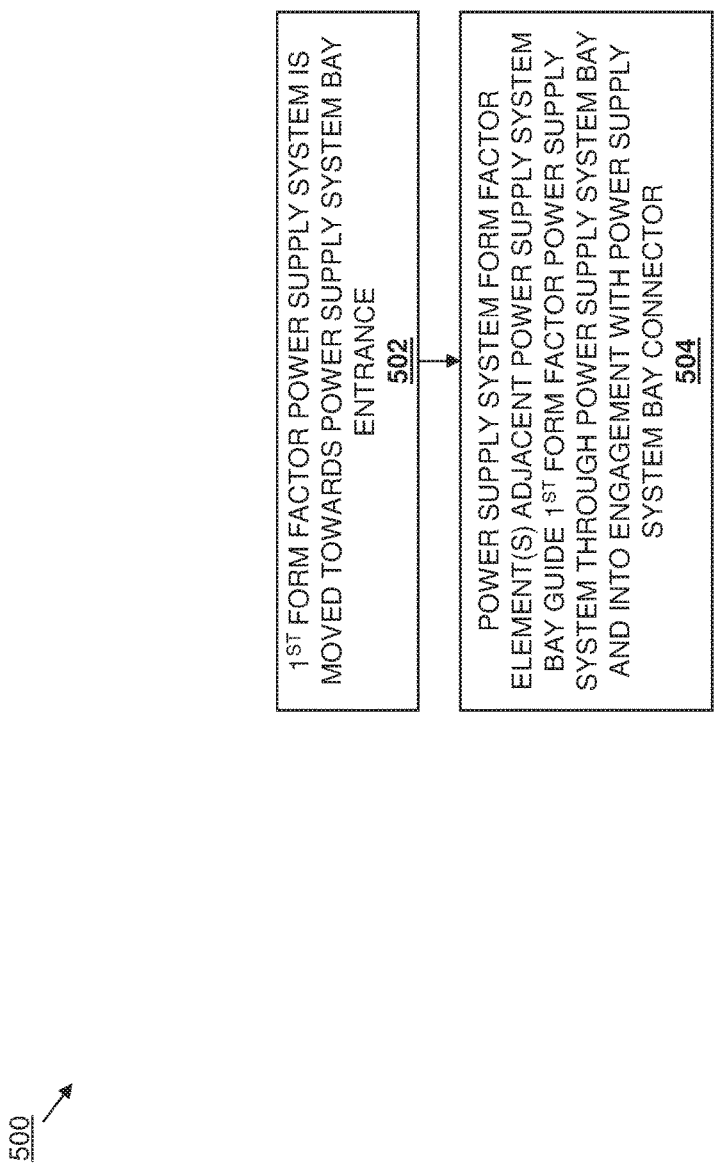
FIG. 5 is a flow chart illustrating an embodiment of a method for providing a power supply system in a power supply system bay.
Figure 7:
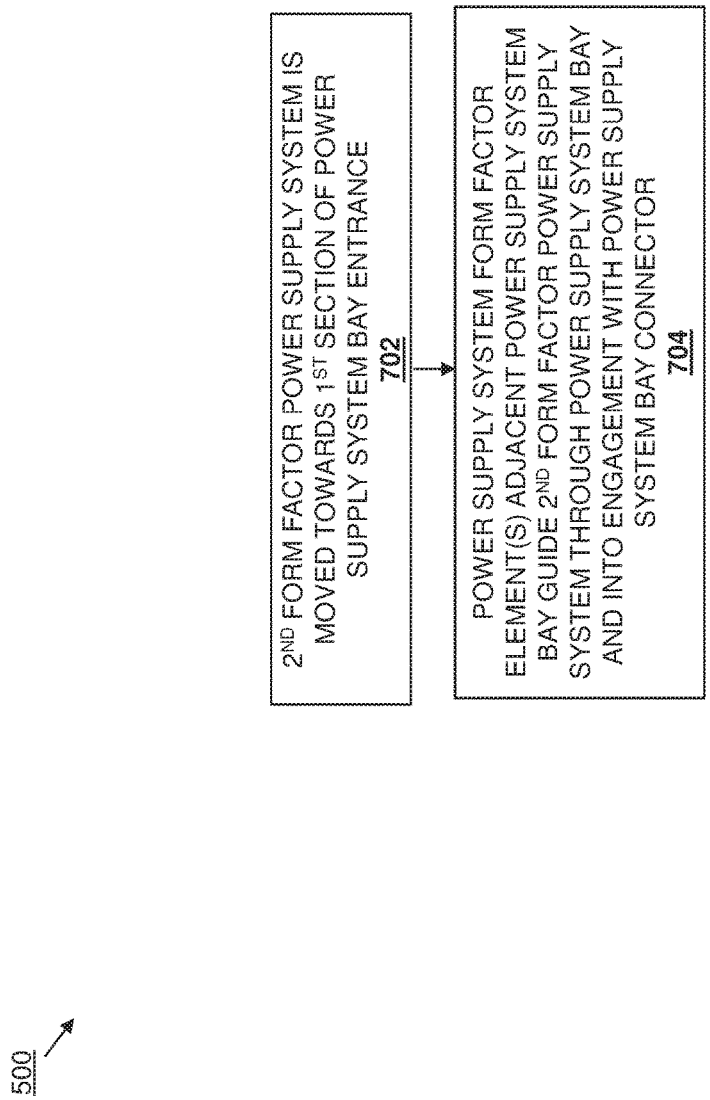
FIG. 7 is a flow chart illustrating an embodiment of a method for providing power supply system in a power supply system bay.
Figure 9:
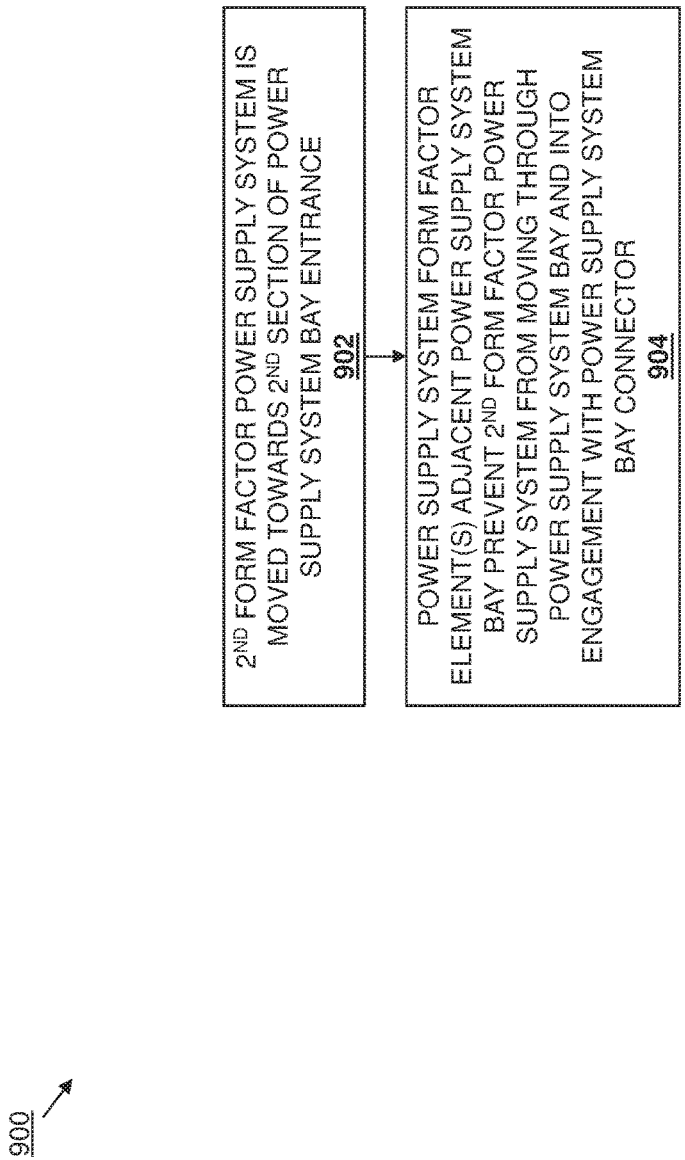
FIG. 9 is a flow chart illustrating an embodiment of a method for providing power supply system in a power supply system bay.

Referring now to FIGS. 5, 7, and 9, embodiments of methods 500, 700, and 900 for providing power supply system(s) in a power supply system bay are illustrated. As described below, the systems and methods of the present disclosure provide a chassis that defines a power supply system bay and includes power supply system form factor elements that are configured to allow different form factor power supplies to be moved through the power supply system bay and into engagement with at least a portion of a power supply system connector, while ensuring that both power supply systems are properly oriented before being allowed to move through the power supply system bay such that they properly engage the power supply system connector. Furthermore, the power supply system form factor elements also help to ensure that non-conforming or non-authorized power supply systems are not utilized with the computing system. As such, a computing device manufacturer may design multiple computing device families with a common power supply system bay that reduces the number of power supply system form factors and associated power configurations that are necessary to meet the differing power requirements available in different power requirements of the computing device families, and avoids the need to develop separate complete power supply system portfolios while maintaining power supply system scalability across the different computing device families.

For example, with reference to the experimental embodiment discussed above, the power supply system bay of the present disclosure was found to reduce the number of power configurations needed in the multiple form factor power supply systems from the 12 different power configurations discussed above to 7 different power configurations (a 36% reduction). Specifically, each of the needed power configurations were satisfied by providing the 86 millimeter width form factor power supply portfolio configurable with 3 different power configurations: a "platinum-level" efficiency 2.4 kilowatt power configuration, a "platinum-level" efficiency 2.0 kilowatt power configuration, and a "platinum-level" efficiency 1.4 kilowatt power configuration; along with the 51.3 millimeter width form factor power supply portfolio configurable with 4 different power configurations: a "platinum-level" efficiency 1.4 kilowatt power configuration with a negative 48-volt input voltage, a "platinum-level" efficiency 750 watt power configuration, a "titanium-level" efficiency 750 watt power configuration, and a "platinum-level" efficiency 495 watt power configuration. However, one of skill in the art in possession of the present disclosure will recognize that additional computing device families and additional form factor power supply systems may be enabled via the teachings of the present disclosure while falling within its scope.

Referring first to FIG. 5, the method 500 begins at block 502 where a first form factor power supply system is moved towards a power supply system bay entrance. Referring now to FIG. 6A, in an embodiment of block 502, the first form factor power supply system 300 may be positioned adjacent the chassis 200 such that the rear surface 302*d* of the first form factor power supply system 300 is located immediately adjacent the power supply system bay entrance 204*a*, with the first power supply system guide 304*a* and the second power supply system guide 304*b* aligned with the first power supply system form factor element 210*a* and the second power supply system form factor element 210*b*. The first form factor power supply system 300 may then be moved in a direction A towards the chassis 200 such that the rear surface 302*d* of the first form factor power supply system 300 moves through the power supply system bay entrance 204*a*.

Figure 6B:
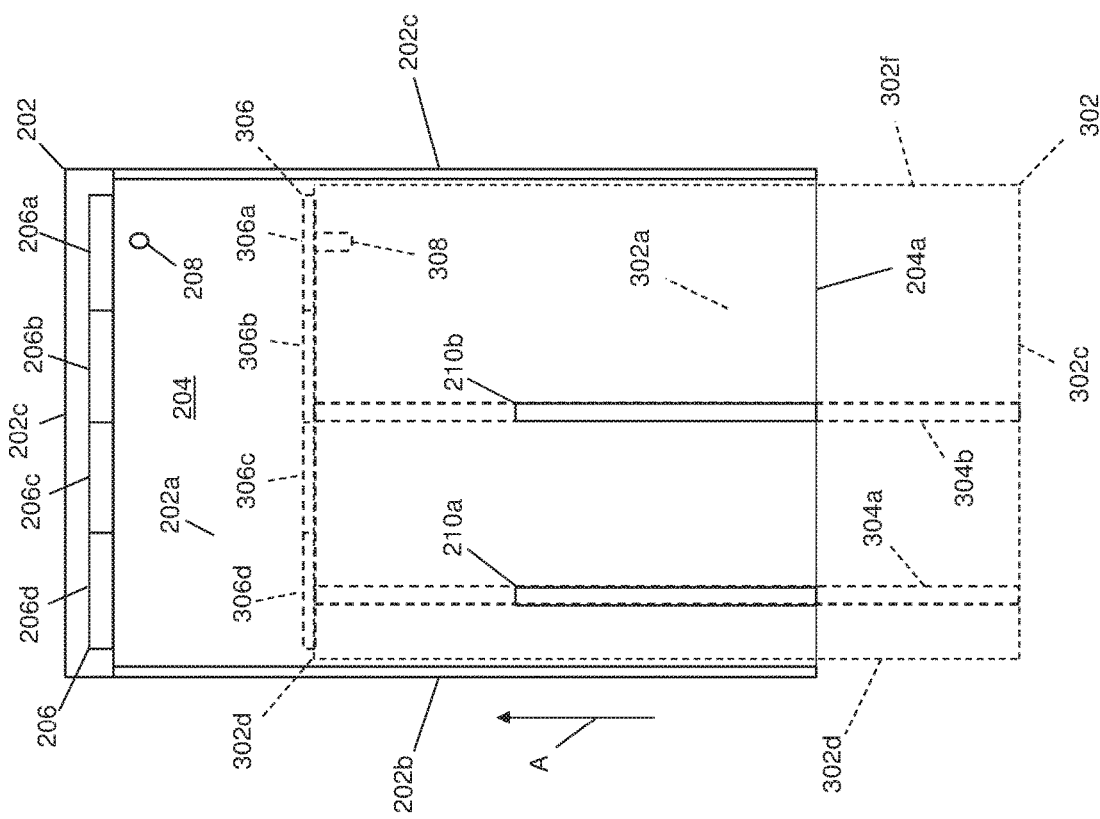
FIG. 6B is a top view illustrating the first form factor power supply system of FIGS. 3A and 3B being coupled to the power supply system bay of FIGS. 2A and 2B.

The method 500 then proceeds to block 504 where power supply system form factor element(s) adjacent a power supply system bay guide the first form factor power supply system through the power supply system bay and into engagement with the power supply system bay connector. Referring now to FIG. 6B, in an embodiment of block 504, the first form factor power supply system 300 (illustrated in dashed lines for clarity) continues to move in the direction A though the power supply system bay entrance 204*a* and into the power supply system bay 204 and, due to the alignment of the first power supply system guide 304*a* and the second power supply system guide 304*b* with the first power supply system form factor element 210*a* and the second power supply system form factor element 210*b*, respectively, the first power supply system form factor element 210*a* enters the first power supply system guide 304*a* and the second power supply system form factor element 210*b* enters the second power supply system guide 304*b* to guide the first form factor power supply system 300 through the power supply system bay 204.

Figure 6C:
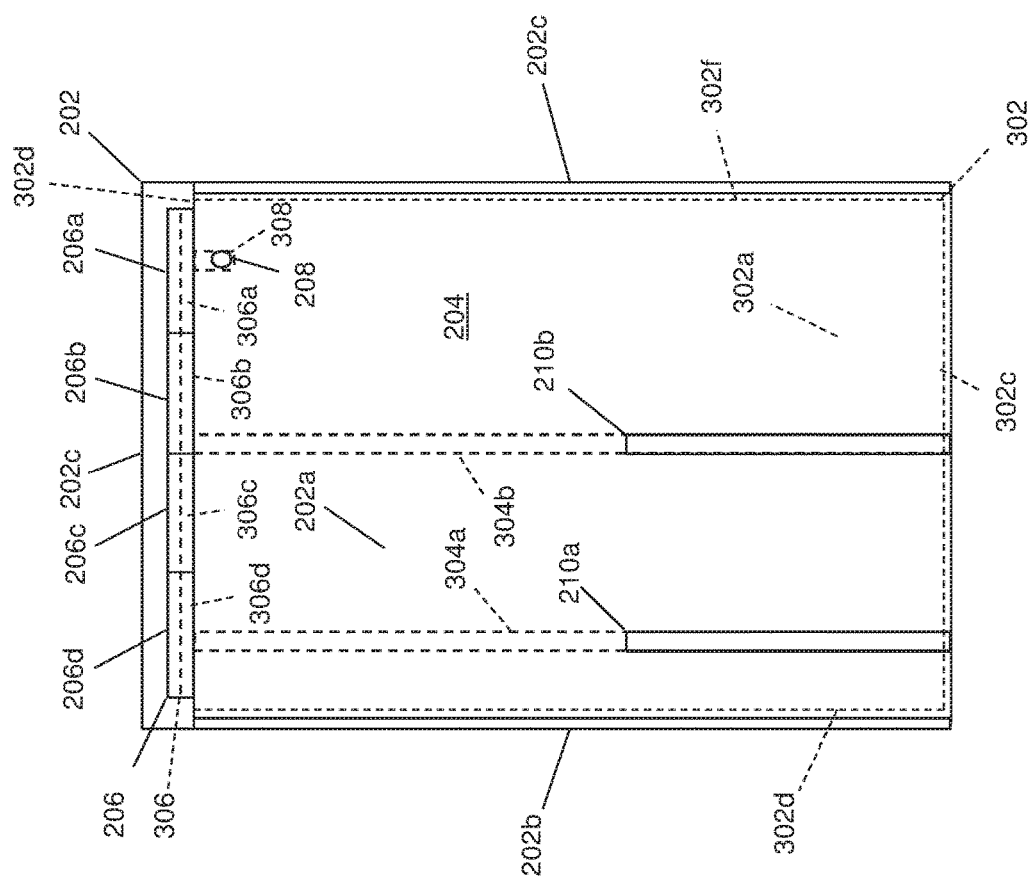
FIG. 6C is a top view illustrating the first form factor power supply system of FIGS. 3A and 3B coupled to the power supply system bay of FIGS. 2A and 2B.

Furthermore, referring now to FIG. 6C, continued movement of the first form factor power supply system 300 (again illustrated in dashed lines for clarity) in the direction A allows the first power supply system form factor element 210*a* and the second power supply system form factor element 210*b* to guide the first form factor power supply system 300 (via their engagement with the first power supply system guide 304*a* and the second power supply system guide 304*b*, respectively) through the power supply system bay 204 such that the connector alignment member 208 on the chassis 200 engages the connector alignment member 308 on the first form factor power supply system 300 to cause the alignment of the signal connector portion 306*a* and the plurality of power connector portions 306*b*, 306c, and 306d on the power supply system connector 306 with the respective signal connector portion 206a and the plurality of power connector portions 206b, 206c, and 206d on the power supply system bay connector 206. As such, continued movement of the first form factor power supply system 300 in the direction A provides for the engagement of the signal connector portion 306a and the plurality of power connector portions 306b, 306c, and 306d on the power supply system connector 306 with the respective signal connector portion 206a and the plurality of power connector portions 206b, 206c, and 206d on the power supply system bay connector 206. As such, the first form factor power supply system 300 may include multiple power connector portions 306b-d on its power supply system connector 306 that engage each of the respective power connector portions 206b-d on the power supply system bay connector 206 to create the power and return/ground paths that provide for the relatively larger (i.e., compared to the second form factor power supply system 400, discussed below) power provision capabilities (e.g., current provisioning) of the first form factor power supply system 300.

As discussed above, the chassis 200 may include a variety of power supply system latching features for securing the first form factor power supply system 300 in the power supply system bay 204. For example, one or more power supply system latching features may be provided on the side wall 202c of the chassis 200 and may engage the first form factor power supply system 300 upon engagement of the engagement of the power supply system connector 306 with the power supply system bay connector 206 in order to secure the first form factor power supply system 300 in the power supply system bay 204. However, one of skill in the art in possession of the present disclosure will recognize that a variety of different locations for power supply system latching features (e.g., the bottom wall 202a, a top wall, etc.) will fall within the scope of the present disclosure as well.

Following the engagement of the power supply system connector 306 on the first form factor power supply system 300 and the power supply system bay connector 206 in the power supply system bay 204, subsystems connected to the power supply system bay connector 206 (e.g., the processing system and/or other subsystems in the IHS 100 discussed above with reference to FIG. 1) may send and receive signals (e.g., control signals) to the first form factor power supply system 300 via the engaged signal connector portions 206a and 306a to, for example, control the operations of the first form factor power supply system 300, receive operating statistics from the first form factor power supply system 300, and/or transmit any other data known in the art with the first form factor power supply system 300. Furthermore, subsystems connected to the power supply system bay connector 206 may also receive power from the first form factor power supply system 300 via the engaged power connector portions 206b-d and 306b-d to, for example, power any or all of those subsystems. In some embodiments, subsystems connected to the power supply system bay connector 206 may also send power to the first form factor power supply system 300 via the engaged power connector portions 206b-d and 306b-d to, for example, charge one or more batteries provided in the first form factor power supply system 300.

Figure 8A:
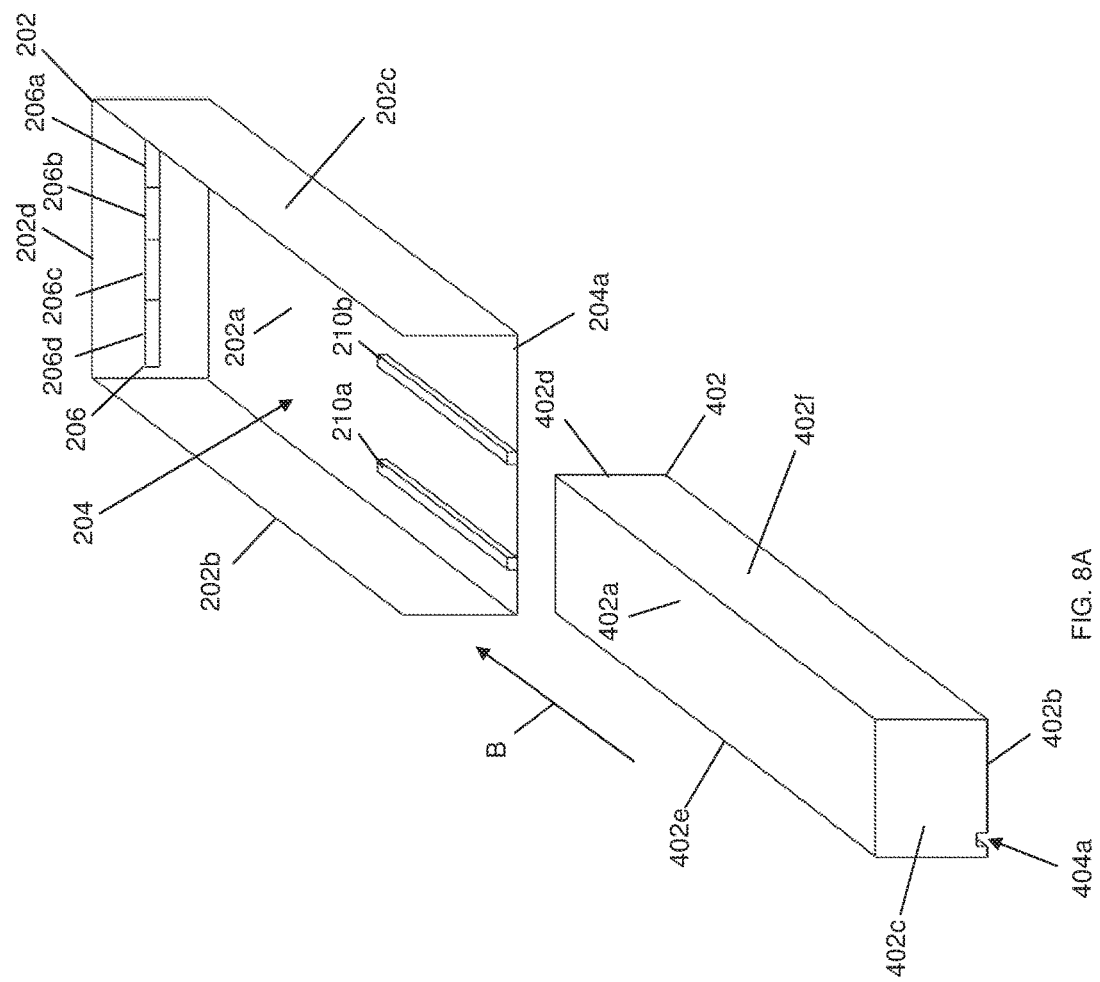
FIG. 8A is a perspective view illustrating the second form factor power supply system of FIGS. 4A and 4B being coupled to the power supply system bay of FIGS. 2A and 2B.

Referring next to FIG. 7, the method 700 begins at block 702 where a second form factor power supply system is moved towards a first section of the power supply system bay entrance. Referring now to FIG. 8A, in an embodiment of block 702, the second form factor power supply system 400 may be positioned adjacent the chassis 200 such that the rear surface 402d of the first form factor power supply system 400 is located immediately adjacent the power supply system bay entrance 204a, with the power supply system guide 404a aligned with the second power supply system form factor element 210b. In the discussions below, this orientation of the second form factor power supply system 400 relative to the power supply system bay entrance 204a is referred to as being located adjacent a "first section" of the power supply system bay entrance 204a (i.e., with the power supply system guide 404a aligned with the second power supply system form factor element 210b) to distinguish it from being located adjacent any "second section" of the power supply system bay entrance 204a that will prevent the second form factor power supply system 400 from being moved into to the power supply system bay entrance 204a For example, the first section of the power supply system bay entrance 204a may provide access to the "primary section" of the power supply system bay 204, discussed above, the always houses a power supply system for the computing device in this embodiment. The second form factor power supply system 400 may then be moved in a direction B towards the chassis 200 such that the rear surface 302d of the second form factor power supply system 400 moves through the power supply system bay entrance 204a.

Figure 8B:
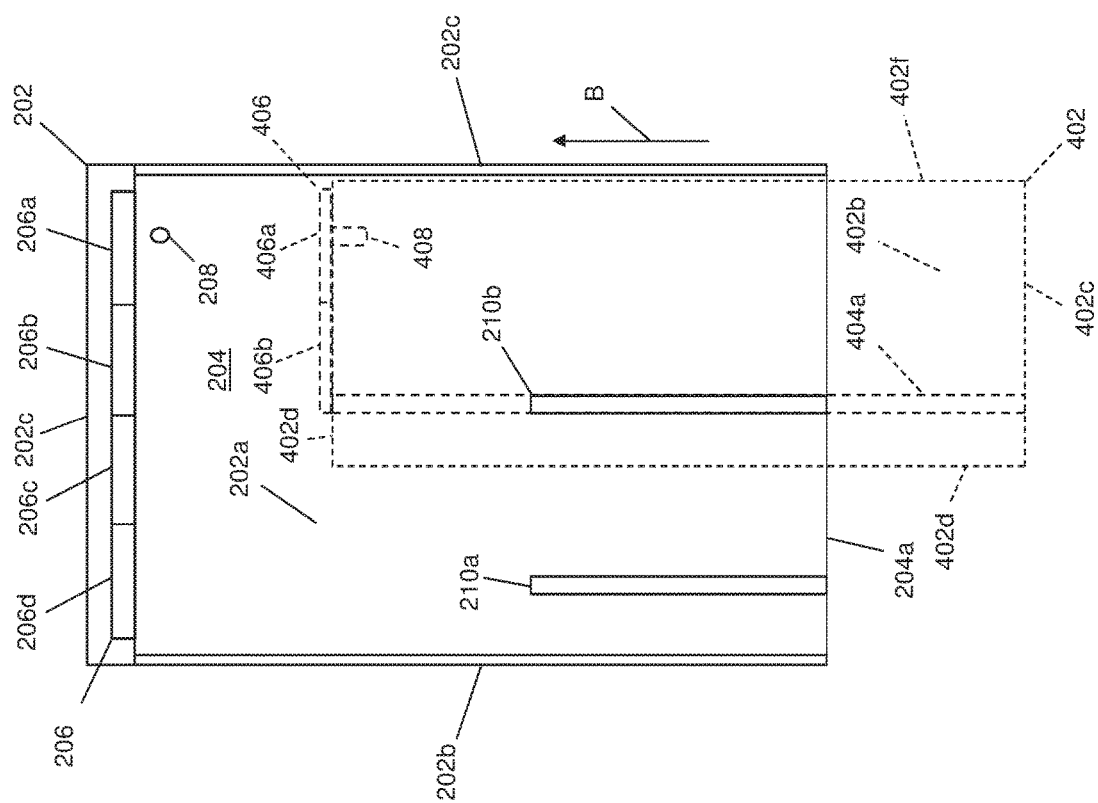
FIG. 8B is a top view illustrating the second form factor power supply system of FIGS. 4A and 4B being coupled to the power supply system bay of FIGS. 2A and 2B.

The method 700 then proceeds to block 704 where the power supply system form factor element(s) adjacent the power supply system bay guide the second form factor power supply system through the power supply system bay and into engagement with a portion of the power supply system bay connector. Referring now to FIG. 8B, in an embodiment of block 704, the second form factor power supply system 400 (illustrated in dashed lines for clarity) continues to move in the direction B though the power supply system bay entrance 204a and into the power supply system bay 204 and, due to the alignment of the power supply system guide 404a with the second power supply system form factor element 210b, the second power supply system form factor element 210b enters the power supply system guide 404a to guide the second form factor power supply system 400 through the power supply system bay 204.

Furthermore, referring now to FIG. 8C, continued movement of the second form factor power supply system 400 (again illustrated in dashed lines for clarity) in the direction B (illustrated in FIG. 8B) allows the second power supply system form factor element 210b to guide the second form factor power supply system 400 (via its engagement with the power supply system guide 404a) through the power supply system bay 204 such that the connector alignment member 208 on the chassis 200 engages the connector alignment member 408 on the second form factor power supply system 400 to cause the alignment of the signal connector portion 406a and the power connector portion 406b on the power supply system connector 406 with the respective signal connector portion 206a and the power connector portion 206b on the power supply system bay connector 206. As such, continued movement of the second form factor power supply system 400 in the direction B provides for the engagement of the signal connector portion 406a and the power connector portion 406b on the power supply system connector 406 with the respective signal connector portion 206a and the power connector portion 206b on the power supply system bay connector 206. As such, the second form factor power supply system 400 may include a single power connector portion 406b on its power supply system connector 406 that engages only a portion of the power supply system bay connector 206 (i.e., the power connector portions 206b) to create the power and return/ground path that provides for the relatively smaller (i.e., compared to the first form factor power supply system 300, discussed above) power provision capabilities (e.g., current provisioning) of the second form factor power supply system 400.

Furthermore, one of skill in the art in possession of the present disclosure will recognize that the power supply system connector 306 on the first form factor power supply system 300 and the power supply system connector 406 on the second form factor power supply system 400 are each configured with common signaling/control pins (i.e., the signal connector portions 306a and 406a) that engage the signaling/control portion of the power supply system bay connector 206 (i.e., the signal connector portion 206a) when they are coupled to the chassis 200 according to the methods 500 and 700 discussed above.

As discussed above, the chassis 200 may include a variety of power supply system latching features for securing the second form factor power supply system 400 in the power supply system bay 204. For example, one or more power supply system latching features may be provided on the side wall 202c of the chassis 200 and may engage the second form factor power supply system 400 upon engagement of the engagement of the power supply system connector 406 with the power supply system bay connector 206 in order to secure the second form factor power supply system 300 in the power supply system bay 204. However, one of skill in the art in possession of the present disclosure will recognize that a variety of different locations for power supply system latching features (e.g., the bottom wall 202a, a top wall, etc.) will fall within the scope of the present disclosure as well.

Following the engagement of the power supply system connector 406 on the second form factor power supply system 400 and the power supply system bay connector 206 in the power supply system bay 204, subsystems connected to the power supply system bay connector 206 (e.g., the processing system and/or other subsystems in the IHS 100 discussed above with reference to FIG. 1) may send and receive signals (e.g., control signals) to the second form factor power supply system 400 via the engaged signal connector portions 206a and 406a to, for example, control the operations of the second form factor power supply system 400, receive operating statistics from the second form factor power supply system 400, and/or transmit any other data known in the art with the second form factor power supply system 400. Furthermore, subsystems connected to the power supply system bay connector 206 may also receive power from the second form factor power supply system 400 via the engaged power connector portions 206b and 406b to, for example, power any or all of those subsystems. In some embodiments, subsystems connected to the power supply system bay connector 206 may also send power to the second form factor power supply system 400 via the engaged power connector portions 206b and 306b to, for example, charge one or more batteries provided in the second form factor power supply system 400.

Figure 10:
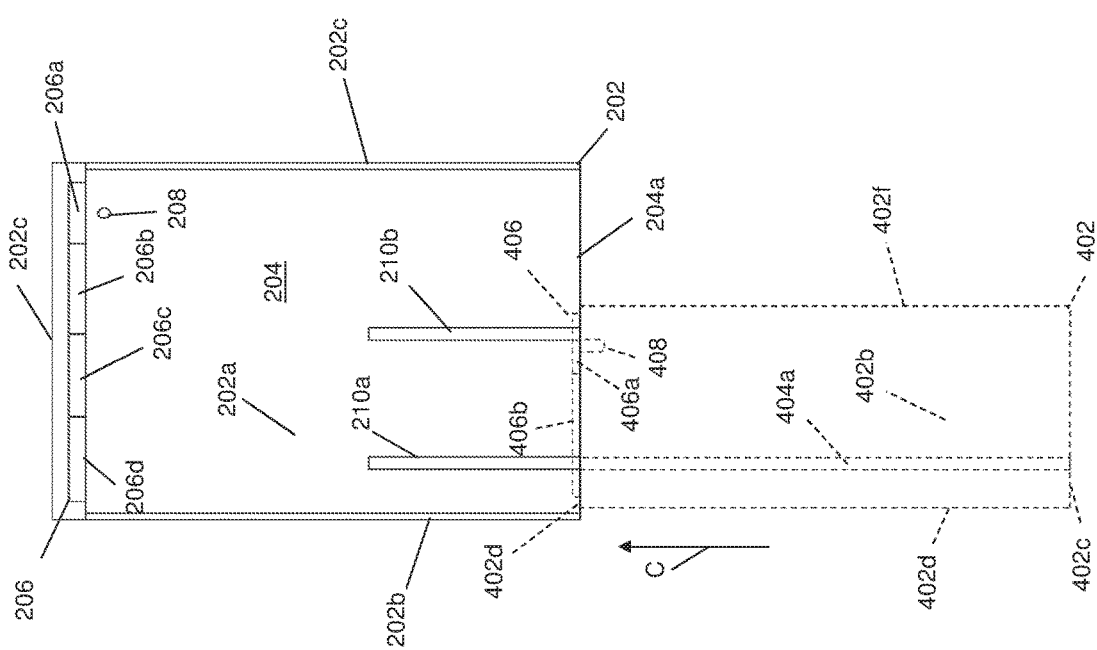
FIG. 10 is a top view illustrating an attempt to incorrectly couple the second form factor power supply system of FIGS. 4A and 4B to the power supply system bay of FIGS. 2A and 2B.

Referring now to FIG. 8, the method 900 begins at block 902 where the second form factor power supply system is moved towards a second portion of the power supply system bay entrance. Referring now to FIG. 10, in an embodiment of block 902, the second form factor power supply system 400 (illustrated in dashed lines for clarity) may be positioned adjacent the chassis 200 such that the rear surface 402d of the first form factor power supply system 400 is located immediately adjacent the power supply system bay entrance 204a, but with the power supply system guide 404a aligned with the first power supply system form factor element 210a.

With reference to the method 700 discussed above, this orientation of the second form factor power supply system 400 relative to the power supply system bay entrance 204a is referred to as being located adjacent a "second section" of the power supply system bay entrance 204a (i.e., with the power supply system guide 404a aligned with the first power supply system form factor element 210a) to distinguish it from being correctly positioned (e.g., located adjacent the "first section" of the power supply system bay entrance 204a) to allow the second form factor power supply system 400 to be moved into to the power supply system bay entrance 204a. However, the second form factor power supply system 400 may be considered to be located adjacent the second section of the power supply system bay entrance 204a anytime the power supply system guide(s) on the second form factor power supply system 400 are not aligned with respective power supply system form factor element(s) in a manner that allows the second form factor power supply system 400 to move through the power supply system bay 204 and into engagement with the power supply system bay connector 206. For example, the second section of the power supply system bay entrance 204a may provide access to the "secondary section" of the power supply system bay 204, discussed above, that restricts the power supply system bay 204 to housing (along with the "primary section" of the power supply system bay 204) particular, larger form factor power supply systems for the computing device (or smaller form factor power supply systems along with secondary devices such as the air plugs, batteries, and/or storage devices discussed below.) The second form factor power supply system 400 may then be moved in a direction C towards the chassis 200.

The method 900 then proceeds to block 904 where the power supply system form factor element(s) adjacent the power supply system bay prevent the second form factor power supply system from moving through the power supply system bay and into engagement with the power supply system bay connector. With continued reference to FIG. 10, the second form factor power supply system 400 is prevented from moving in the direction C though the power supply system bay entrance 204a and into the power supply system bay 204 due to the engagement of the second power supply system form factor element 210b with the rear surface 402d on the second form factor power supply system 400. As such, the movement of the second form factor power supply system 400 through the power supply system bay 204 such that the power supply system connector 406 engages the power supply system bay connector 206 is prevented as well. Furthermore, one of skill in the art in possession of the present disclosure will recognize that the first power supply system form factor element 210a and/or the second power supply system form factor element 210b will operate to prevent the second form factor power supply system 400 (or any other form factor power supply systems with a similar power supply system guide) from being moved through the power supply system bay 204 (and into engagement with the power supply system bay connector 206) in any of a variety of orientations that do not result in the second form factor power supply system 400 being moved through the first section of the power supply system bay entrance 204a.

Figure 11:
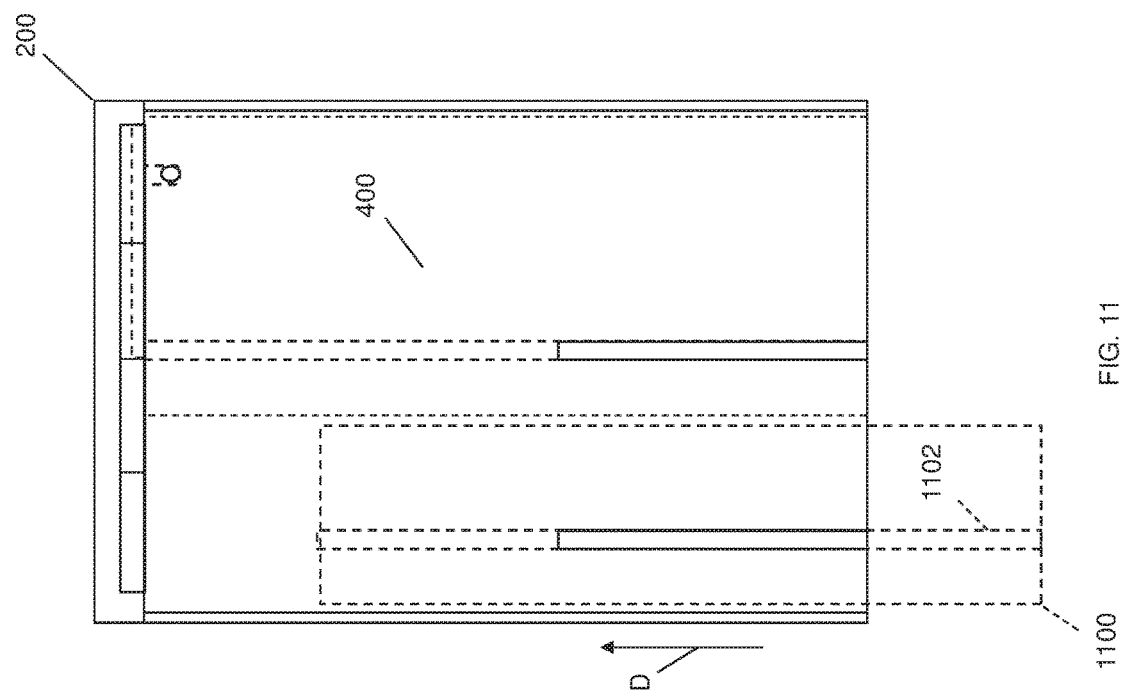
FIG. 11 is a top view illustrating a device located in the power supply system bay adjacent the second form factor power supply system of FIG. 8C.

Referring now to FIG. 11, and with reference to the method 700 discussed above with reference to FIG. 7, in embodiments in which the second form factor power supply system 400 is located in the power supply system bay 204 defined by the chassis 200 and engaging the power supply system bay connector 206, a device 1100 may be provided in the power supply system bay 204 adjacent the second form factor power supply system 400. For example, the device 1100 may include a device guide 1102 that is substantially similar to the power supply system guides 304a, 304b, and 404a, discussed above. As such, the device 1100 may be dimensioned, and device guide 1102 may be oriented on the device 1100, in a manner that allows the device 1100 to be moved in a direction D though the power supply system bay entrance 204a such that the first power supply system form factor element 210a moves through the device guide 1102 in order to allow the device 1100 to move through the power supply system bay 204, as illustrated in FIG. 11, and be positioned adjacent the second form factor power supply system 400.

In some embodiments, the device 1100 may be an air plug utilized to, for example, block airflow through the power supply system bay 204 adjacent the second form factor power supply system 400. In some embodiments, the device 1100 may be a supplemental power supply device that includes a supplemental power supply device connector that is configured to engage at least one of the power connector portions on the power supply system bay connector 206 (e.g., the power connector portion 206d in the illustrated embodiment) and provide power via that engagement to subsystems connected to the power supply system bay connector 206 in substantially the same manner as discussed above. Furthermore, the power supply system bay connector 206 may be modified from the embodiment illustrated and described above in order to allow such a supplemental power supply device to engage a signal connector portion of the power supply system bay connector 206 when positioned in the power supply system bay 204 in order to allow data to be exchanged with subsystems connected to the power supply system bay connector 206 in substantially the same manner as discussed above. In yet other embodiments, the device 1100 may be a variety of other system components (e.g., hard drives, memory subsystems, processing subsystems, video subsystems, and/or other IHS subsystems known in the art) that includes a connector that is configured to engage signal and/or power connector portions on the power supply system bay connector 206 to allow for the interaction with subsystems connected to the power supply system bay connector 206 in substantially the same manner as discussed above as well.

As discussed above, the chassis 200 may include a variety of power supply system latching features for securing the device 1100 in the power supply system bay 204. For example, one or more power supply system latching features may be provided on the side wall 202b of the chassis 200 and may engage the device 1100 upon its positioning fully within the power supply system bay 204 in order to secure the device 1100 in the power supply system bay 204. However, one of skill in the art in possession of the present disclosure will recognize that a variety of different locations for power supply system latching features (e.g., the bottom wall 202a, a top wall, etc.) will fall within the scope of the present disclosure as well. Furthermore, the device 1100 and/or the second form factor power supply system 400 may also include latching features that may engage each other in order to secure the device 1100 and/or the second form factor power supply system 400 in the power supply system bay 204. For example, the device 1100 may engage latching features on the side wall 202b to secure the device 1100 in the power supply system bay 204, and then the second form factor power supply 400 may engage latching features on the device 1100 to secure the second form factor power supply system 400 in the power supply system bay 204.

Figure 12:
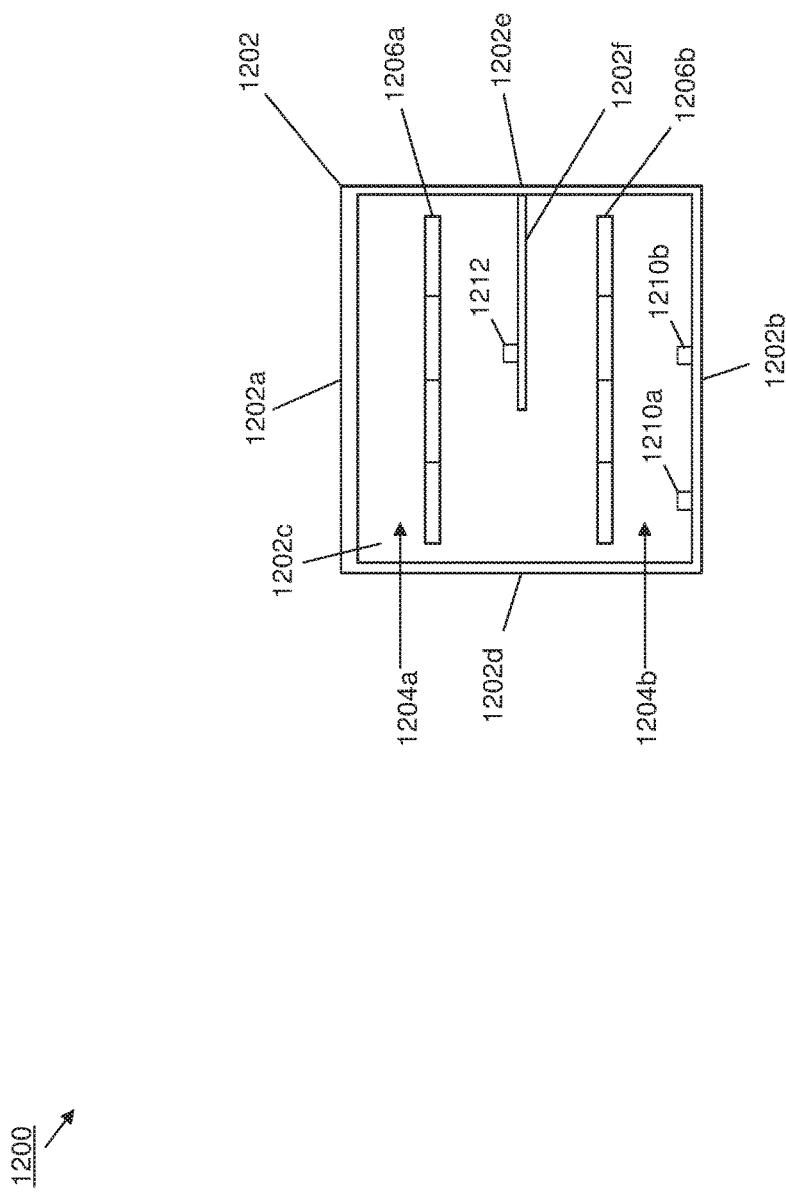
FIG. 12 is a front view illustrating an embodiment of a power supply system bay.

Referring now to FIG. 12, an embodiment of a chassis 1200 is illustrated that is similar to the chassis 200 discussed above, but with the ability to house more power supply systems and thus provide a wider range of power solutions for computing devices. As such, the chassis 1200 may be provided as part of the chassis 116 discussed above with reference to FIG. 1, and thus may be provided with an IHS 100 or provided to house one or more components of the IHS 100. Similarly as with the chassis 200, the portion of the chassis 1200 may be included in a server device, although switch devices, storage devices, desktop computing devices, laptop/notebook computing devices, and/or other computing devices will benefit from the teachings of the present disclosure and thus fall within its scope. The chassis 1200 illustrated in FIG. 1200 includes a base 1202 that, in the illustrated embodiment, includes a top wall 1202a, a bottom wall 1202b that is located opposite the base 1202 from the top wall 1202a, an end wall 1202c that extends between the top wall 1202a and the bottom wall 1202b, a pair of side walls 1202d and 1202e that are located opposite the base 1202 from each other and that extend between the top wall 1202a, the bottom wall 1202b, and the end wall 1202c, and an interior wall 1202f that extends between the side wall 1202e and a portion of the end wall 1202c. However, one of skill in the art in possession of the present disclosure will recognize that the chassis 1200 may include a variety of features and house a variety of components (i.e., the IHS components discussed above with reference to FIG. 1) while remaining within the scope of the present disclosure.

In the embodiments discussed below, the base 1202 of the chassis 1200 defines a power supply system bay 1204a between the top wall 1202a, the side walls 1202d and 1202e, the end wall 1202c, and the interior wall 1202f; and a power supply system bay 1204b between the bottom wall 1202b, the side walls 1202d and 1202e, the end wall 1202c, and the interior wall 1202f. While not illustrated, each of the power supply system bays 1204a and 1204b may include power supply system bay entrances similar to the power supply system bay entrance 204a discussed above. Similarly as with the chassis 200, the chassis 1200 may include a variety of power supply system latching features for securing power supply systems (or other devices) in the power supply system bays 1204a and 1204b. In the illustrated embodiment, power supply system bay connectors 1206a and 1206b are located on or adjacent the end wall 1202c and each of the power supply system bays 1204a and 1204b, respectively. While not specifically called out with element numbers, one of skill in the art in possession of the present disclosure will recognize that each of the power supply system bay connectors 1206a and 1206b may include a signal connector portion and a plurality of power connector portions, as discussed above with the power supply system bay connector 206. Similarly, a connector alignment member similar to the connector alignment member 208 may be provided adjacent the power supply system bays 1204a and 1204b (e.g., on the bottom wall 1202b and the interior wall 1202f.)

In the illustrated embodiment, a first power supply system form factor element 1210a and a second power supply system form factor element 1210b extend from the bottom wall 1202b in a spaced apart orientation from each other and the side walls 1202d and 1202e, and may be substantially similar to the first power supply system form factor element 210a and the second power supply system form factor element 210b discussed above. In addition, a second power supply system form factor element 1212 extends from the interior wall 1202f in a spaced apart orientation from the side wall 1202e, and may be substantially similar to the second power supply system form factor element 210b discussed above.

Figure 13A:
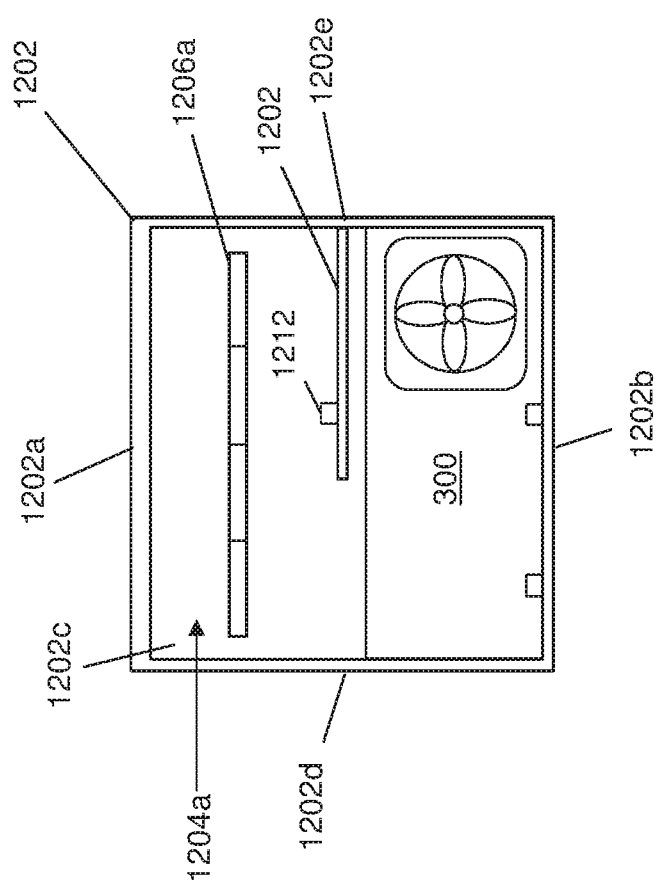
FIG. 13A is a front view illustrating an embodiment of one of the first form factor power supply systems of FIGS. 3A and 3B located in the power supply system bay of FIG. 12.
Figure 13B:
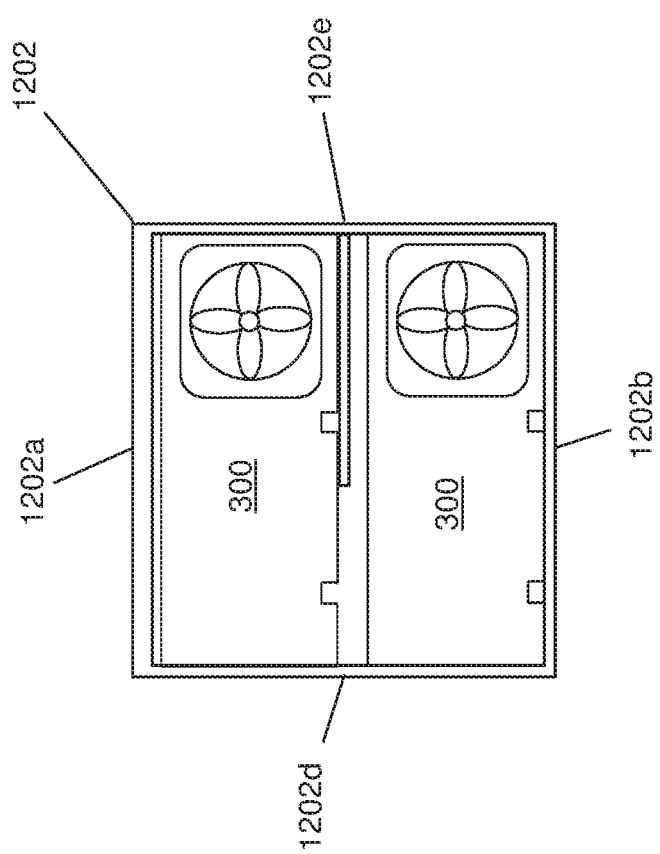
FIG. 13B is a front view illustrating an embodiment of multiple ones of the first form factor power supply system of FIGS. 3A and 3B located in the power supply system bay of FIG. 12.
Figure 13C:
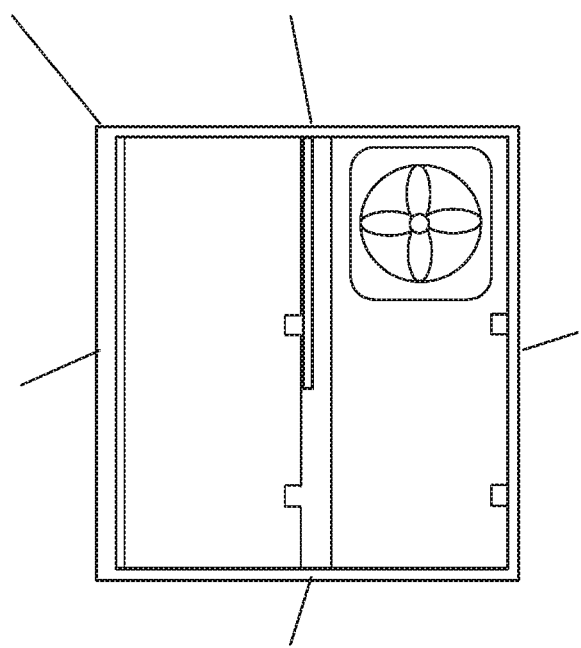
FIG. 13C is a front view illustrating an embodiment of one of the first form factor power supply systems of FIGS. 3A and 3B, along with a non-power supply system device, located in the power supply system bay of FIG. 12.

Referring now to FIGS. 13A-13G, examples are illustrated of different combinations of the first form factor power supply system 300, the second form factor power supply system 400, and/or non-power supply system devices, positioned in the power supply system bays 1204a and 1204b. FIG. 13A illustrates how the first form factor power supply system 300 may be positioned in the power supply system bay 1204b (e.g., substantially as described above with reference to the power supply system bay 204.) FIG. 13B illustrates how multiple ones of the first form factor power supply system 300 may be positioned in the power supply system bay 1204a and 1204b (e.g., substantially as described above with reference to the power supply system bay 204, with the exception that the first power supply system guide 304a on the first form factor power supply system 300 in the power supply system bay 1204a does not engage a power supply system form factor element.) FIG. 13C illustrates how the first form factor power supply system 300 may be positioned in the power supply system bay 1204b (e.g., substantially as described above with reference to the power supply system bay 204), while a non-power supply system device 1300 (e.g., similar to the device 1100 discussed above) may be positioned in the power supply system bay 1204a.

Figure 13D:
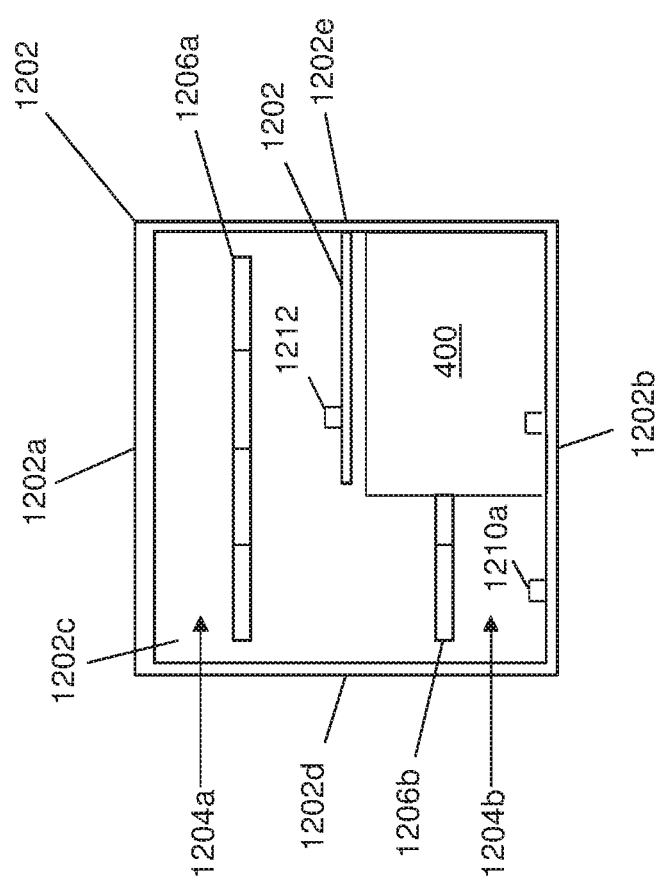
FIG. 13D is a front view illustrating an embodiment of one of the second form factor power supply systems of FIGS. 4A and 4B located in the power supply system bay of FIG. 12.
Figure 13E:
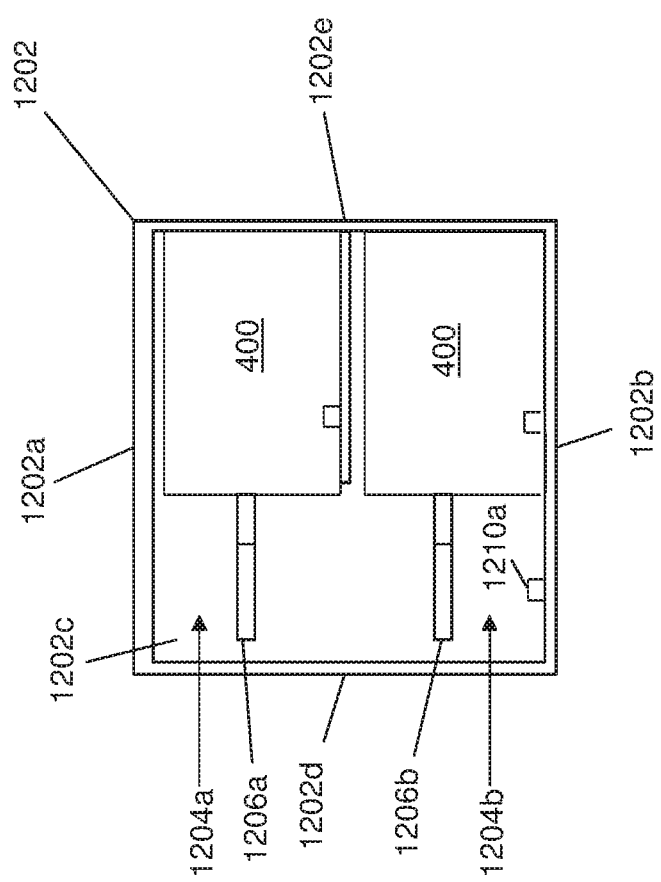
FIG. 13E is a front view illustrating an embodiment of multiple ones of the second form factor power supply system of FIGS. 4A and 4B located in the power supply system bay of FIG. 12.
Figure 13F:
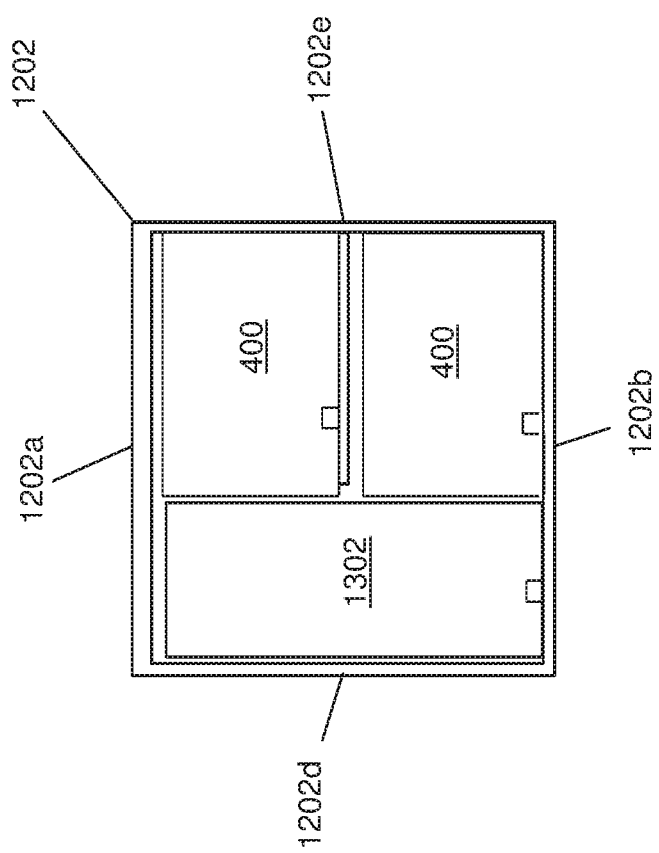
FIG. 13F is a front view illustrating an embodiment of multiple ones of the second form factor power supply system of FIGS. 4A and 4B, along with a non-power supply system device, located in the power supply system bay of FIG. 12.
Figure 13G:
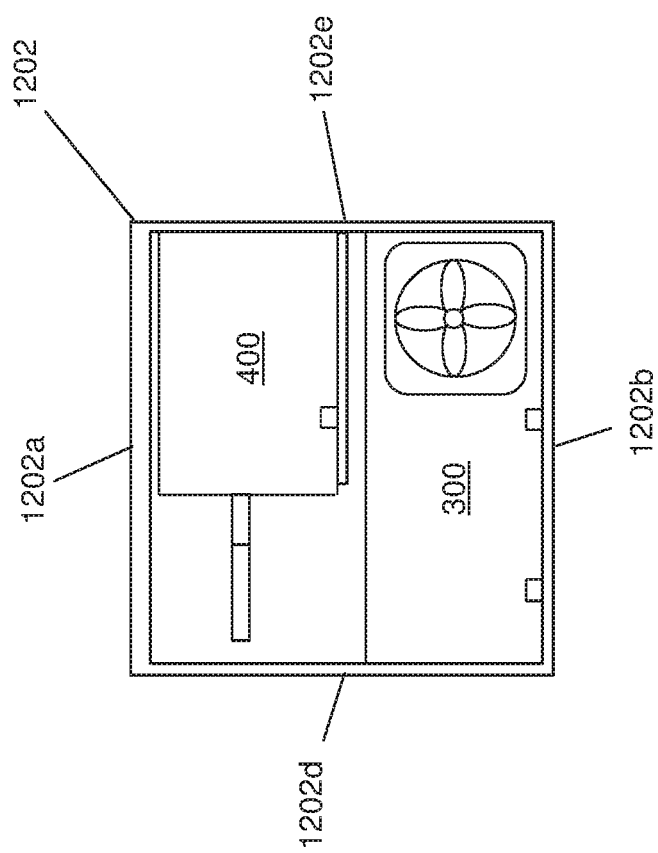
FIG. 13G is a front view illustrating an embodiment of one of the first form factor power supply systems of FIGS. 3A and 3B, along with one of the second form factor power supply systems of FIGS. 4A and 4B, located in the power supply system bay of FIG. 12

FIG. 13D illustrates how the second form factor power supply system 400 may be positioned in a portion of the power supply system bay 1204b (e.g., substantially as described above with reference to the power supply system bay 204.) FIG. 13E illustrates how multiple ones of the second form factor power supply system 400 may be positioned in portions of the power supply system bays 1204a and 1204b (e.g., substantially as described above with reference to the power supply system bay 204.) FIG. 13F illustrates how multiple ones of the second form factor power supply system 400 may be positioned in portions of the power supply system bays 1204a and 1204b (e.g., substantially as described above with reference to the power supply system bay 204), while a non-power supply system device 1302 (e.g., similar to the device 1100 discussed above) may be positioned in the portions of the power supply system bays 1204a and 1204b that are not occupied by the second form factor power supply systems 400. FIG. 13G illustrates how the first form factor power supply system 300 may be positioned in the power supply system bay 1204b (e.g., substantially as described above with reference to the power supply system bay 204), and the second form factor power supply system 400 may be positioned in a portion of the power supply system bay 1204b (e.g., substantially as described above with reference to the power supply system bay 204.)

One of skill in the art in possession of the present disclosure will recognize that other combinations of power supply systems and non-power supply system devices other than those illustrated in FIGS. 13A-G may be enabled by the chassis 1200 while remaining within the scope of the present disclosure. Furthermore, one of skill in the art in possession of the present disclosure will also recognize how the teachings of the present disclosure may be extended to power supply system bays that house more power supply systems, and/or more than two different form factor power supply systems, in order to extend the range of power supply system configurations to meet the needs of virtually any computing device while optimizing power supply system portfolios and power configurations.

Thus, systems and methods have been described that provide a chassis with a power supply system bay that is capable of housing multiple different form factor power supply systems while ensuring that when any of those different form factor power supply systems is utilized, it is properly connected to a system power connector to allow for signal and power exchange with subsystems that are connected to the system power connector. The features on the chassis that provide such functionality also provide the added benefit of helping to prevent non-conforming or non-authorized power supply systems from being utilized in the chassis. As such, the systems and methods of the present disclosure allow for the reduction of power supply system portfolios utilized with server families by, for example, allowing different form factor power supply systems to be utilized across different server families while ensuring that each of those server families may utilize a wide range of power configurations that satisfy a wide range of power requirements. Benefits may also be realized by utilizing the multi-form factor power supply system bay in some computing device families, while providing computing families with smaller form factor power supply system bays (i.e., that only utilize the smaller form factor power supply system.)

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computing system, comprising:
a chassis defining a bay having a bay entrance;
a bay connector that is located on the chassis adjacent the bay; and
at least one bay access element that is located on the chassis adjacent the bay, wherein the at least one bay access element is configured to:
guide a first device in the bay and into engagement with the bay connector when the first device is moved through the bay entrance;
guide a second device in the bay and into engagement with the bay connector when the second device is moved through a first section of the bay entrance, wherein the second device is different than the first device; and
prevent movement of the second device through the bay and into engagement with the bay connector when the second device attempts to move through a second section of the bay entrance that is different than the first section.

2. The system of claim 1, wherein the at least one bay access element includes a first bay access element and a second bay access element, and
wherein the first bay access element and the second bay access element are configured to enter respective first and second channels defined by the first device to guide the first device in the bay and into engagement with the bay connector, and
wherein the second bay access element is configured to enter a first channel defined by the second device to guide the second device in the bay and into engagement with the bay connector when the second device is moved through the first section of the bay entrance, and
wherein the second bay access element is configured to engage a surface on the second device to prevent movement of the second device in the bay and into engagement with the bay connector when the second device attempts to move through the second section of the bay entrance.

3. The system of claim 1, wherein the bay connector includes a signal connector portion and a plurality of power connector portions, and wherein the engagement of the first device with the bay connector includes an engagement of a first device connector on the first device with the signal connector portion and each of the plurality of power connector portions on the bay connector, and wherein the engagement of the second device with bay connector includes an engagement of a second device connector on the second device with the signal connector portion and a subset of the plurality of power connector portions on the bay connector.

4. The system of claim 1, further comprising:

a connector alignment member that is located on the chassis adjacent the bay and the bay connector, wherein the connector alignment member is configured to align either of the first device and the second device for engagement with the bay connector.

5. The system of claim 1, wherein the at least one bay access element is configured to:

guide a third device in the bay such that the third device is located adjacent the second device when the second device is located in the bay and engaging the bay connector.

6. The system of claim 5, wherein the third device is configured to prevent airflow through the bay adjacent the second device when the second device is located in the bay and engaging the bay connector.

7. The system of claim 5, wherein the third device is configured to engage the bay connector in response to being guided in the bay, and wherein the third device is configured to provide power through the bay connector.

8. An information handling system (IHS), comprising:

a chassis;

a processing system that is located in the chassis;

a memory system that is located in the chassis and that is coupled to the processing system;

a device housing that is defined by the chassis and that includes a device entrance; and a chassis connector that is coupled to the processing system and that is located on the chassis adjacent the device housing, wherein the chassis is configured to:

guide a first device in the device housing and into engagement with the chassis connector when the first device is moved through the device entrance;

guide a second device in the device housing and into engagement with the chassis connector when the second device is moved through a first section of the device entrance, wherein the second device is different than the first device; and prevent movement of the second device through the device housing and into engagement with the chassis connector when the second device attempts to move through a second section of the device entrance that is different than the first section.

9. The IHS of claim 8, wherein the chassis includes a first device housing access element and a second device housing access element, and wherein the first device housing access element and the second device housing access element are configured to enter respective first and second channels defined by the first device to guide the first device in the device housing and into engagement with the chassis connector, and wherein the second device housing access element is configured to enter a first channel defined by the second device to guide the second device in the device housing and into engagement with the chassis connector when the second device is moved through the first section of the device entrance, and wherein the second device housing access element is configured to engage a surface on the second device to prevent movement of the second device in the device housing and into engagement with the chassis connector when the second device attempts to move through the second section of the device entrance.

10. The IHS of claim 8, wherein the chassis connector includes a signal connector portion and a plurality of power connector portions, and wherein the engagement of the first device with the chassis connector includes an engagement of a first device connector on the first device with the signal connector portion and each of the plurality of power connector portions on the chassis connector, and wherein the engagement of the second device with chassis connector includes an engagement of a second device connector on the second device with the signal connector portion and a subset of the plurality of power connector portions on the chassis connector.

11. The IHS of claim 8, further comprising:

a connector alignment member that is located on the chassis adjacent the device housing and the chassis connector, wherein the connector alignment member is configured to align either of the first device and the second device for engagement with the chassis connector.

12. The IHS of claim 8, wherein the at least one device form factor element is configured to:

guide a third device in the device housing such that the third device is located adjacent the second device when the second device is located in the device housing and engaging the chassis connector.

13. The IHS of claim 12, wherein the third device is configured to prevent airflow through the device housing adjacent the second device when the second device is located in the device housing and engaging the chassis connector.

14. A method for providing devices in a device housing, comprising:

guiding, by a chassis that defines a device housing including a device entrance, a first device in the device housing and into engagement with a chassis connector when the first device is moved through the device entrance;

guiding, by the chassis, a second device in the device housing and into engagement with the chassis connector when the second device is moved through a first section of the device entrance, wherein the second device is different than the first device; and preventing, by the chassis, movement of the second device through the device housing and into engagement with the chassis connector when the second device attempts to move through a second section of the device entrance that is different than the first section.

15. The method of claim 14, further comprising:

entering, by a first device housing access element and a second device housing access element that are included on the chassis, respective first and second channels defined by the first device to guide the first device in the device housing and into engagement with the chassis connector;

entering, by the second device housing access element, a first channel defined by the second device to guide the second device in the device housing and into engagement with the chassis connector when the second device is moved through the first section of the device entrance; and engaging, by the second device housing access element, a surface on the second device to prevent movement of the second device in the device housing and into engagement with the chassis connector when the second device attempts to move through the second section of the device entrance.

16. The method of claim 14, further comprising:

engaging, by a first device connector on the first device, a signal connector portion and each of a plurality of power connector portions on the chassis connector; and engaging, by a second device connector on the second device, the signal connector portion and a subset of the plurality of power connector portions on the chassis connector.

17. The method of claim 14, further comprising:

aligning, by a connector alignment member that is located on the chassis adjacent the device housing and the chassis connector, either of the first device and the second device for engagement with the chassis connector.

18. The method of claim 14, further comprising:

guiding, by the chassis, a third device in the device housing such that the third device is located adjacent the second device when the second device is located in the device housing and engaging the chassis connector.

19. The method of claim 18, further comprising:

preventing, by the third device, airflow through the device housing adjacent the second device when the second device is located in the device housing and engaging the chassis connector.

20. The method of claim 18, further comprising:

engaging, by the third device in response to being guided through the device housing, a portion of the chassis connector; and providing, by the third device, power through the device connector.

* * * * *